United States Patent
Lim et al.

(10) Patent No.: US 11,496,137 B2
(45) Date of Patent: Nov. 8, 2022

(54) AUTOMATIC FREQUENCY CALIBRATION AND LOCK DETECTION CIRCUIT AND PHASE LOCKED LOOP INCLUDING TE SAME

(71) Applicant: Samsung Electronics Co., Ltd., Suwon-si (KR)

(72) Inventors: Baekmin Lim, Daejeon (KR); Seungjin Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/536,514

(22) Filed: Nov. 29, 2021

(65) Prior Publication Data
US 2022/0190834 A1    Jun. 16, 2022

(30) Foreign Application Priority Data

Dec. 10, 2020 (KR) .......................... 10-2020-0172456
Feb. 2, 2021 (KR) .......................... 10-2021-0014722

(51) Int. Cl.
*H03L 7/095* (2006.01)
*H03L 7/099* (2006.01)
(Continued)

(52) U.S. Cl.
CPC ............ *H03L 7/095* (2013.01); *H03L 7/0891* (2013.01); *H03L 7/099* (2013.01); *H03M 7/16* (2013.01)

(58) Field of Classification Search
CPC ....... H03L 7/095; H03L 7/0891; H03L 7/099; H03M 7/16
See application file for complete search history.

(56) References Cited

U.S. PATENT DOCUMENTS 5,870,002 A    2/1999   Ghaderi et al.
6,320,469 B1  11/2001   Friedberg et al.
(Continued)

FOREIGN PATENT DOCUMENTS

KR    10-0723838 B1    5/2007
KR    10-0891225 B1    4/2009

OTHER PUBLICATIONS

V. Melikyan et al. 'Digital Lock Detector for PLL' *IEEE Xplore*, 2008.

*Primary Examiner* — Adam D Houston
(74) *Attorney, Agent, or Firm* — Harness, Dickey & Pierce, P.L.C.

(57) ABSTRACT

An automatic frequency calibration and lock detection circuit includes a frequency error generator circuit, an automatic frequency calibration signal generator circuit, and a lock flag generator circuit. The frequency error generator circuit generates a frequency error signal based on a reference frequency signal and an output frequency signal. The frequency error signal represents a difference between a frequency of the output frequency signal and a target frequency. The automatic frequency calibration signal generator circuit generates an automatic frequency calibration output signal and an automatic frequency calibration done signal based on the frequency error signal and a first clock signal. The lock flag generator circuit generates a lock done signal based on the frequency error signal, the automatic frequency calibration done signal and a second clock signal. The frequency error generator circuit is shared by the automatic frequency calibration signal generator circuit and the lock flag generator circuit.

20 Claims, 20 Drawing Sheets

(51) Int. Cl.
   *H03L 7/089*   (2006.01)
   *H03M 7/16*    (2006.01)

(56) References Cited

U.S. PATENT DOCUMENTS

| | | | |
|---|---|---|---|
| 6,762,631 | B1 | 7/2004 | Kumar |
| 7,082,178 | B2 | 7/2006 | Meltzer |
| 7,271,634 | B1* | 9/2007 | Daga ................ H03L 7/0818 |
| | | | 327/158 |
| 7,424,082 | B2 | 9/2008 | Choi |
| 7,425,858 | B1* | 9/2008 | Daga ................ H03L 7/0818 |
| | | | 327/158 |
| 7,982,552 | B2 | 7/2011 | Shin et al. |
| 8,358,159 | B1* | 1/2013 | Eker ................... H03L 7/095 |
| | | | 327/156 |
| 9,479,184 | B2 | 10/2016 | Hsieh et al. |
| 9,564,908 | B2 | 2/2017 | Song et al. |
| 10,097,283 | B1* | 10/2018 | Yeager ............... H04L 27/127 |
| 10,158,367 | B1 | 12/2018 | Yu et al. |
| 2019/0166557 | A1* | 5/2019 | Chen ................. H03F 3/45475 |
| 2019/0199361 | A1* | 6/2019 | Sudalaiyandi ........ H03L 7/0814 |
| 2020/0076439 | A1* | 3/2020 | Weeks ................ H03L 7/0805 |
| 2020/0393869 | A1* | 12/2020 | August ................... G06F 1/12 |
| 2022/0107675 | A1* | 4/2022 | Kim ........................ G05F 1/56 |
| 2022/0190834 | A1* | 6/2022 | Lim ...................... H03L 7/095 |

* cited by examiner

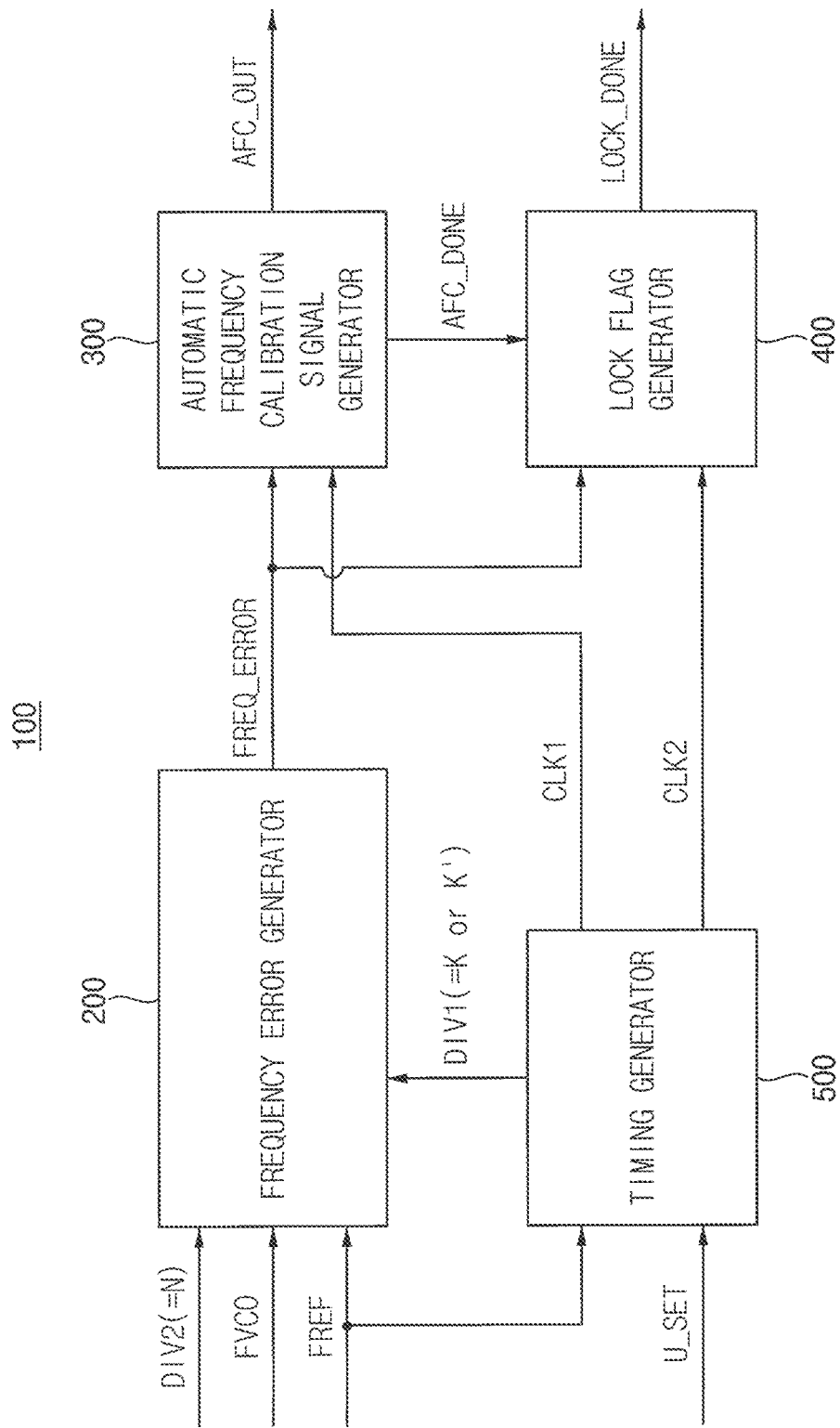

AUTOMATIC FREQUENCY CALIBRATION AND LOCK DETECTION CIRCUIT AND PHASE LOCKED LOOP INCLUDING TE SAME

CROSS-REFERENCE TO RELATED APPLICATION

This application claims priority under 35 USC § 119 to Korean Patent Application No. 10-2020-0172456 filed on Dec. 10, 2020 and to Korean Patent Application No. 10-2021-0014722 filed on Feb. 2, 2021 in the Korean Intellectual Property Office (KIPO), the contents of which are herein incorporated by reference in their entirety.

BACKGROUND

1. Technical Field

At least some example embodiments of the inventive concepts, relate generally to semiconductor integrated circuits, and more particularly to automatic frequency calibration and lock detection circuits, and phase locked loops including the automatic frequency calibration and lock detection circuits.

2. Description of the Related Art

In spite of improvements of speed of peripheral devices, such as memory, communication devices, or graphic devices, and a data transmission rate, operating speeds of peripheral devices have not kept up with an operating speed of processors, in some cases. Further, a speed difference between new microprocessors and their peripheral devices is often present. Thus, some high performance digital systems have been required to dramatically improve speed of peripheral devices.

For example, like a data transmission between a memory device and a memory controller, in an input and output method of transmitting data by synchronizing a clock signal, a load of a bus increases and a transmission frequency becomes faster. Thus it is very important to temporally synchronize the clock signal and data. To this end, a phase locked loop (PLL) circuit, a delay locked loop (DLL) circuit, etc. are used. The PLL and the DLL are used in a variety of application circuits.

SUMMARY

At least one example embodiment of the inventive concepts provides an automatic frequency calibration and lock detection circuit capable of reducing a circuit area by sharing a component.

At least one example embodiment of the inventive concepts provides a phase locked loop including the automatic frequency calibration and lock detection circuit.

According to at least some example embodiments of the inventive concepts of the inventive concepts, an automatic frequency calibration and lock detection circuit includes a frequency error generator circuit, an automatic frequency calibration signal generator circuit, and a lock flag generator circuit. The frequency error generator circuit is configured to generate a frequency error signal based on a reference frequency signal and an output frequency signal. The frequency error signal represents a difference between a frequency of the output frequency signal and a target frequency. The automatic frequency calibration signal generator circuit is configured to generate an automatic frequency calibration output signal and an automatic frequency calibration done signal based on the frequency error signal and a first clock signal. The automatic frequency calibration output signal represents a result of a first calibration operation on the output frequency signal. The automatic frequency calibration done signal represents a completion of the first calibration operation. The lock flag generator circuit is configured to generate a lock done signal based on the frequency error signal, the automatic frequency calibration done signal and a second clock signal. The lock done signal represents a completion of a second calibration operation on the output frequency signal. The frequency error generator circuit is shared by the automatic frequency calibration signal generator circuit and the lock flag generator circuit.

According to at least some example embodiments of the inventive concepts, a phase locked loop includes an automatic frequency calibration and lock detection circuit, a control circuit, a capacitor bank array and a voltage controlled oscillator (VCO) circuit. The automatic frequency calibration and lock detection circuit is configured to generate an automatic frequency calibration output signal and a lock done signal based on a reference frequency signal and an output frequency signal. The automatic frequency calibration output signal represents a result of a first calibration operation on the output frequency signal. The lock done signal represents a completion of a second calibration operation on the output frequency signal. The control circuit is configured to generate a voltage control signal based on the reference frequency signal and the output frequency signal. At least a part of the capacitor bank array is selectively enabled based on the automatic frequency calibration output signal. The voltage controlled oscillator circuit is configured to generate the output frequency signal based on the capacitor bank array and the voltage control signal. The automatic frequency calibration and lock detection circuit includes a frequency error generator circuit, an automatic frequency calibration signal generator circuit, and a lock flag generator circuit. The frequency error generator circuit is configured to generate a frequency error signal based on the reference frequency signal and the output frequency signal. The frequency error signal represents a difference between a frequency of the output frequency signal and a target frequency. The automatic frequency calibration signal generator circuit is configured to generate the automatic frequency calibration output signal and an automatic frequency calibration done signal based on the frequency error signal and a first clock signal. The automatic frequency calibration done signal represents a completion of the first calibration operation. The lock flag generator circuit is configured to generate the lock done signal based on the frequency error signal, the automatic frequency calibration done signal and a second clock signal. The frequency error generator circuit is shared by the automatic frequency calibration signal generator circuit and the lock flag generator circuit.

According to at least some example embodiments of the inventive concepts, an automatic frequency calibration and lock detection circuit includes a frequency counter, a digital comparator circuit, an automatic frequency calibration signal generator circuit, a lock flag generator circuit and a timing generator circuit. The frequency counter circuit is configured to generate a frequency count signal and a frequency threshold signal based on a reference frequency signal, an output frequency signal, a first division control signal and a second division control signal. The frequency count signal represents a count value for the output frequency signal. The frequency threshold signal represents a target frequency. The digital comparator circuit is configured to generate a frequency error signal by comparing the frequency count signal with the frequency threshold signal. The frequency error signal represents a difference between a frequency of the output frequency signal and the target frequency. The automatic frequency calibration signal generator circuit is configured to generate an automatic frequency calibration output signal and an automatic frequency calibration done signal based on the frequency error signal and a first clock signal. The automatic frequency calibration output signal represents a result of a first calibration operation on the output frequency signal. The automatic frequency calibration done signal represents a completion of the first calibration operation. The lock flag generator circuit is configured to generate a lock done signal based on the frequency error signal, the automatic frequency calibration done signal and a second clock signal. The lock done signal represents a completion of a second calibration operation on the output frequency signal. The timing generator circuit is configured to generate the first clock signal, the second clock signal and the first division control signal. During a first operation phase in which the first calibration operation is performed, the automatic frequency calibration signal generator circuit is enabled and the lock flag generator circuit is disabled. During a second operation phase in which the second calibration operation is performed subsequent to the first operation phase, the automatic frequency calibration signal generator circuit is disabled and the lock flag generator circuit is enabled. The frequency counter circuit is configured to generate a divided reference frequency signal by dividing the reference frequency signal based on the first division control signal, and generate the frequency count signal by counting the frequency of the output frequency signal based on the divided reference frequency signal. A frequency threshold value that is included in the frequency threshold signal and corresponds to the target frequency is determined based on the first division control signal and the second division control signal.

In the automatic frequency calibration and lock detection circuit and the phase locked loop according to at least some example embodiments of the inventive concepts, the automatic frequency calibration circuit and the lock detection circuit may share some components that have similar configurations. For example, the frequency error generator circuit may be shared by the automatic frequency calibration signal generator circuit performing the automatic frequency calibration function and the lock flag generator circuit performing the lock detection function. Accordingly, the automatic frequency calibration and lock detection circuit and the phase locked loop may be efficiently implemented such that the automatic frequency calibration and lock detection circuit and the phase locked loop performs the same performance and function with the reduced circuit area.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 1 is a block diagram illustrating an automatic frequency calibration and lock detection circuit according to at least some example embodiments of the inventive concepts.

DETAILED DESCRIPTION

Figure 2A:
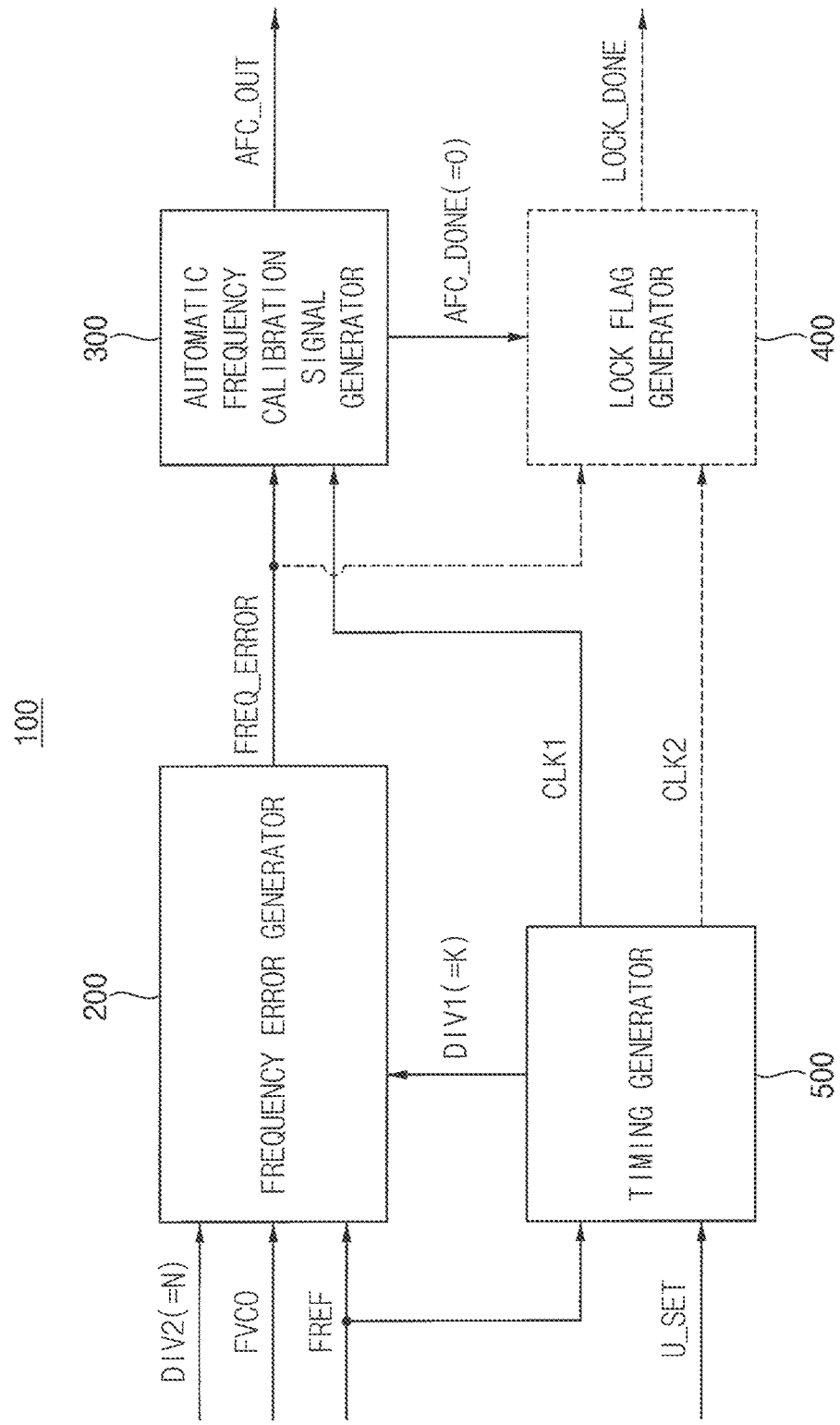
FIGS. 2A and 2B are diagrams for describing an operation of an automatic frequency calibration and lock detection circuit of FIG. 1.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software.

Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating an automatic frequency calibration and lock detection circuit according to at least some example embodiments of the inventive concepts.

Referring to FIG. 1, an automatic frequency calibration (AFC) and lock detection (LD) circuit 100 includes a frequency error generator 200, an automatic frequency calibration signal generator 300, and a lock flag generator 400. The automatic frequency calibration and lock detection circuit 100 may further include a timing generator 500. According to at least some example embodiments of the inventive concepts, each of the frequency error generator 200, automatic frequency calibration signal generator 300, lock flag generator 400, and timing generator 500 may be embodied by a circuit and/or circuitry. Accordingly, the frequency error generator 200, automatic frequency calibration signal generator 300, lock flag generator 400, and timing generator 500 may also be referred to, in the present specification, as the frequency error generator circuit 200, automatic frequency calibration signal generator circuit 300, lock flag generator circuit 400, and timing generator circuit 500, respectively.

The automatic frequency calibration and lock detection circuit 100 may be included in a phase locked loop (PLL). The phase locked loop may generate an output frequency signal FVCO, and may perform a calibration operation (or a correction operation or a compensation operation) such that the output frequency signal FVCO has a desired frequency (e.g., a target frequency). When the phase locked loop generates the output frequency signal FVCO, the automatic frequency calibration and lock detection circuit 100 may be used to perform an automatic frequency calibration function (or an automatic frequency calibration operation) corresponding to an initial calibration operation and a lock detection function (or a lock detection operation) representing a completion of the calibration operation. A detailed configuration and operation of the phase locked loop will be described with reference to FIGS. 8 through 13.

The frequency error generator 200 generates a frequency error signal FREQ_ERROR based on a reference frequency signal FREF, the output frequency signal FVCO, a first division control signal DIV1 and a second division control signal DIV2. A detailed configuration of the frequency error generator 200 will be described with reference to FIGS. 3 and 4.

The output frequency signal FVCO may be generated and provided by the phase locked loop including the automatic frequency calibration and lock detection circuit 100.

The reference frequency signal FREF may be used to detect or sense a frequency of the output frequency signal FVCO. For example, the frequency of the output frequency signal FVCO may be detected by counting edges (e.g., rising edges or falling edges) of the output frequency signal FVCO based on the reference frequency signal FREF.

The frequency error signal FREQ_ERROR may represent a difference between the frequency of the output frequency signal FVCO and the target frequency. For example, the frequency error signal FREQ_ERROR may be a digital code.

The first division control signal DIV1 may include an integer K or K', where K is a positive integer greater than or equal to two. For example, the first division control signal DIV1 may be used to divide the reference frequency signal FREF or to determine a frequency threshold value corresponding to the target frequency.

The second division control signal DIV2 may include an integer N, where N is a positive integer greater than or equal to two. For example, the second division control signal DIV2 may be used to determine the frequency threshold value corresponding to the target frequency. The second division control signal DIV2 may be the same or substantially the same as a division control signal that is used in the phase locked loop including the automatic frequency calibration and lock detection circuit 100. In other words, the phase locked loop including the automatic frequency calibration and lock detection circuit 100 may be an integer-N phase locked loop.

The automatic frequency calibration signal generator 300 generates an automatic frequency calibration output signal (or an automatic frequency calibration result signal) AFC_OUT and an automatic frequency calibration done signal (or an automatic frequency calibration completion signal) AFC_DONE based on the frequency error signal FREQ_ERROR and a first clock signal CLK1. The automatic frequency calibration output signal AFC_OUT represents a result of a first calibration operation on the output frequency signal FVCO. The automatic frequency calibration done signal AFC_DONE represents a completion of the first calibration operation. A detailed configuration of the automatic frequency calibration signal generator 300 will be described with reference to FIGS. 5 and 6.

The first calibration operation may be a coarse calibration operation for calibrating the frequency of the output frequency signal FVCO such that the output frequency signal FVCO has a first frequency close to the target frequency. For example, the automatic frequency calibration output signal AFC_OUT representing the result of the first calibration operation may be provided to a capacitor bank array that is included in the phase locked loop including the automatic frequency calibration and lock detection circuit 100. For example, according to at least some example embodiments of the inventive concepts, the first calibration operation may include enabling at least a part or some of a plurality of capacitors that are included in the capacitor bank array.

According to at least some example embodiments of the inventive concepts, the first calibration operation may be performed by a first loop that is included in the phase locked loop including the automatic frequency calibration and lock detection circuit 100. For example, the first loop may include the frequency error generator 200, the automatic frequency calibration signal generator 300, the capacitor bank array, etc. In other words, the first calibration operation may be performed by the frequency error generator 200 and the automatic frequency calibration signal generator 300. The first calibration operation may correspond to the automatic frequency calibration function. A configuration of the first loop will be described with reference to FIGS. 8 through 13.

The lock flag generator 400 generates a lock done signal (or a lock completion signal) LOCK_DONE based on the frequency error signal FREQ_ERROR, the automatic frequency calibration done signal AFC_DONE and a second clock signal CLK2. The lock done signal LOCK_DONE represents a completion of a second calibration operation on the output frequency signal FVCO.

The second calibration operation may be performed after the first calibration operation is completed, and may be a fine calibration operation for calibrating the frequency of the output frequency signal FVCO such that the output frequency signal FVCO has the target frequency. For example, when the lock done signal LOCK_DONE is activated, the calibration operation that is performed on the output frequency signal FVCO by the phase locked loop including the automatic frequency calibration and lock detection circuit 100 may be terminated.

According to at least some example embodiments of the inventive concepts, the second calibration operation may be performed by a second loop that is different from the first loop and is included in the phase locked loop including the automatic frequency calibration and lock detection circuit 100. The operation of checking the completion of the second calibration operation may correspond to the lock detection function. A configuration of the second loop will be described with reference to FIGS. 8 through 13.

In the automatic frequency calibration and lock detection circuit 100 according to at least some example embodiments of the inventive concepts, the frequency error generator 200 may be shared by the automatic frequency calibration signal generator 300 and the lock flag generator 400. For example, according to at least some example embodiments of the inventive concepts, the aforementioned sharing of the frequency error generator may refer to a single frequency error generator (e.g., the frequency error generator 200) providing a frequency error signal FREQ_ERROR to both of the automatic frequency calibration signal generator 300 and the lock flag generator 400 instead of requiring a frequency error generator for each one of the automatic frequency calibration signal generator 300 and the lock flag generator 400 (i.e., instead of requiring at least two frequency error generators total). The frequency error generator 200 and the automatic frequency calibration signal generator 300 may form an automatic frequency calibration circuit, and the frequency error generator 200 and the lock flag generator 400 may form a lock detection circuit.

The timing generator 500 may generate the first clock signal CLK1, the second clock signal CLK2 and the first division control signal DIV1. The timing generator 500 may set and change the integer K or K' that is included in the first division control signal DIV1 based on a user setting signal U_SET. For example, the integer K or K' may be differently set when the first calibration operation is performed and when the second calibration operation is performed, which will be described with reference to FIGS. 2A and 2B.

An automatic frequency calibration function and a lock detection function are important functions that are required to check whether an output of a phase locked loop is locked while the phase locked loop has a wide frequency output. An automatic frequency calibration circuit performing the automatic frequency calibration function may be used to coarsely (or roughly or approximately) control or adjust a frequency of the output using a capacitor bank array that is connected to a voltage controlled oscillator (VCO) in the phase locked loop, and may be used to detect or find a frequency close to a target frequency by generating a signal to control the capacitor bank array. After the automatic frequency calibration function is performed, the phase locked loop may finely (or precisely or accurately) control or adjust the frequency of the output, and may generate the output having an accurate target frequency. A lock detection circuit performing the lock detection function may be used to check whether the output of the phase locked loop reaches the target frequency and to finally generate a lock flag signal.

The above-described automatic frequency calibration function may be performed only at an initial operation time of the phase locked loop, and after that, the automatic frequency calibration function may not be performed until the phase locked loop is restarted or reset. In other words, the automatic frequency calibration function may be a foreground calibration function, and may not operate after a coarse bit for setting the capacitor bank array is detected or found at the initial operation time. Typically, the automatic frequency calibration circuit may include a plurality of flip-flops and may have a relatively large area within the phase locked loop, and thus there may be a problem of inefficiency because the automatic frequency calibration circuit does not have much time to be used.

In the automatic frequency calibration and lock detection circuit 100 according to at least some example embodiments of the inventive concepts, the automatic frequency calibration circuit and the lock detection circuit may share some components that have similar configurations. For example, the frequency error generator 200 may be shared by the automatic frequency calibration signal generator 300 performing the automatic frequency calibration function and the lock flag generator 400 performing the lock detection function. Accordingly, the automatic frequency calibration and lock detection circuit 100 may be efficiently implemented such that the automatic frequency calibration and lock detection circuit 100 performs the same performance and function with the reduced circuit area.

For example, if the frequency error resolution of the frequency error generator 200 is X bits, where X is a positive integer greater than or equal to two, the frequency error generator 200 may include X (or more) flip-flops. In a conventional art where each of the automatic frequency calibration circuit and the lock detection circuit includes a frequency error generator, 2*X flip-flops may be required. When the automatic frequency calibration and lock detection circuit 100 is implemented according to at least some example embodiments of the inventive concepts such that the frequency error generator 200 is shared by the automatic frequency calibration signal generator 300 and the lock flag generator 400, only X flip-flops may be used, and thus the circuit area may be reduced.

Figure 2B:
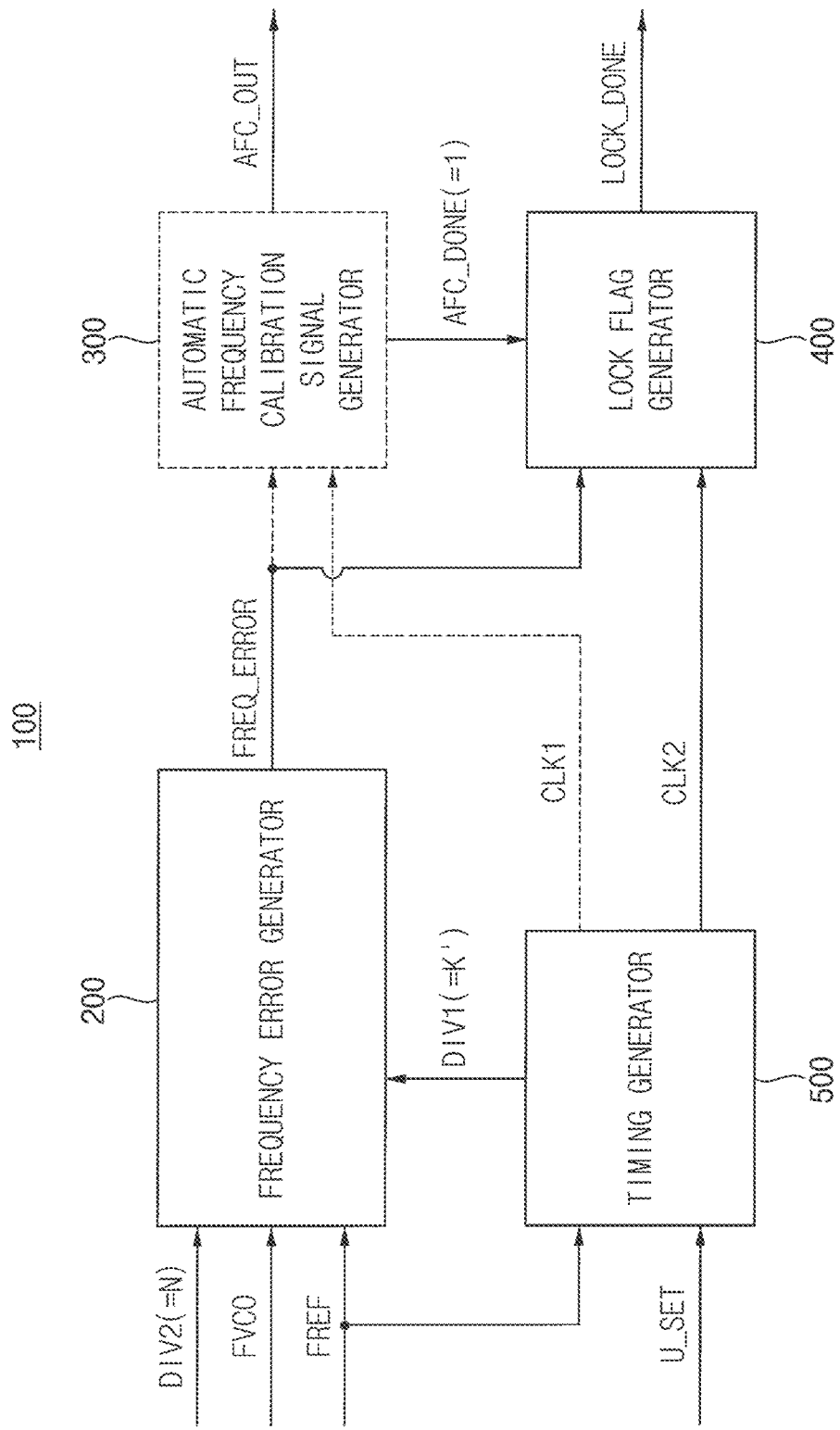

FIGS. 2A and 2B are diagrams for describing an operation of an automatic frequency calibration and lock detection circuit of FIG. 1.

Referring to FIG. 2A, during a first operation phase in which the first calibration operation is performed, the automatic frequency calibration signal generator 300 may be enabled or activated, and the lock flag generator 400 may be disabled or deactivated. In FIG. 2A and subsequent drawings, disabled components are illustrated by dotted lines.

For example, during the first operation phase in which the first calibration operation is performed, the frequency error generator 200 may generate the frequency error signal FREQ_ERROR based on the reference frequency signal FREF, the output frequency signal FVCO, the first division control signal DIV1 including the integer K and the second division control signal DIV2, and the automatic frequency calibration signal generator 300 may generate the automatic frequency calibration output signal AFC_OUT and the automatic frequency calibration done signal AFC_DONE based on the frequency error signal FREQ_ERROR and the first clock signal CLK1. The automatic frequency calibration done signal AFC_DONE may be deactivated to have a first logic level (e.g., "0"), and the lock flag generator 400 may be disabled based on the automatic frequency calibration done signal AFC_DONE having the first logic level.

Referring to FIG. 2B, during a second operation phase in which the second calibration operation is performed subsequent to the first operation phase, the automatic frequency calibration signal generator 300 may be disabled, and the lock flag generator 400 may be enabled.

For example, when the first calibration operation is completed, the automatic frequency calibration done signal AFC_DONE may be activated to have a second logic level (e.g., "1"), and the lock flag generator 400 may be enabled based on the automatic frequency calibration done signal AFC_DONE having the second logic level. After the automatic frequency calibration done signal AFC_DONE is activated, the automatic frequency calibration signal generator 300 may be disabled.

During the second operation phase in which the second calibration operation is performed, the frequency error generator 200 may generate the frequency error signal FREQ_ERROR based on the reference frequency signal FREF, the output frequency signal FVCO, the first division control signal DIV1 including the integer K' and the second division control signal DIV2, and the lock flag generator 400 may generate the lock done signal LOCK_DONE based on the frequency error signal FREQ_ERROR and the second clock signal CLK2.

According to at least some example embodiments of the inventive concepts, the integer K in the first division control signal DIV1 during the first operation phase and the integer K' in the first division control signal DIV1 during the second operation phase may be set differently from each other. In other words, the integer K in the first division control signal DIV1 while the first calibration operation is performed may be different from the integer K' in the first division control signal DIV1 while the second calibration operation is performed.

The integer K or K' in the first division control signal DIV1 may be associated with or related to a time interval for counting the frequency of the output frequency signal FVCO. For example, as will be described with reference to FIGS. 3, 11A and 11B, the frequency of the output frequency signal FVCO may be detected by dividing the reference frequency signal FREF based on the integer K or K' in the first division control signal DIV1 and by counting the edges in the output frequency signal FVCO for a time interval corresponding to the divided reference frequency signal (e.g., FREF/K or FREF/K'). In other words, a time interval that is required to observe the frequency of the output frequency signal FVCO and to generate the frequency error may vary depending on the integer K or K'. Therefore, the time interval for detecting the frequency of the output frequency signal FVCO may be controlled by adjusting the integer K or K' in the first division control signal DIV1 based on the user setting signal U_SET, and thus a ppm value of the frequency error may be controlled.

According to at least some example embodiments of the inventive concepts, the integer K' may be greater than the integer K. For example, during the first operation phase in which the first calibration operation (e.g., the coarse calibration operation) is performed, the frequency error signal FREQ_ERROR having a coarse frequency error value may be generated by observing the frequency of the output frequency signal FVCO for a first time interval corresponding to the divided reference frequency signal (e.g., FREF/K) that is obtained by dividing the reference frequency signal FREF by the integer K. For example, during the second operation phase in which the second calibration operation (e.g., the fine calibration operation) is performed, the frequency error signal FREQ_ERROR having a fine frequency error value may be generated by observing the frequency of the output frequency signal FVCO for a second time interval corresponding to the divided reference frequency signal (e.g., FREF/K') that is obtained by dividing the reference frequency signal FREF by the integer K'. The second time interval may be longer than the first time interval.

However, at least some example embodiments of the inventive concepts are not limited thereto, and the integer K in the first division control signal DIV1 during the first operation phase and the integer K' in the first division control signal DIV1 during the second operation phase may be set equal to each other.

Figure 3:
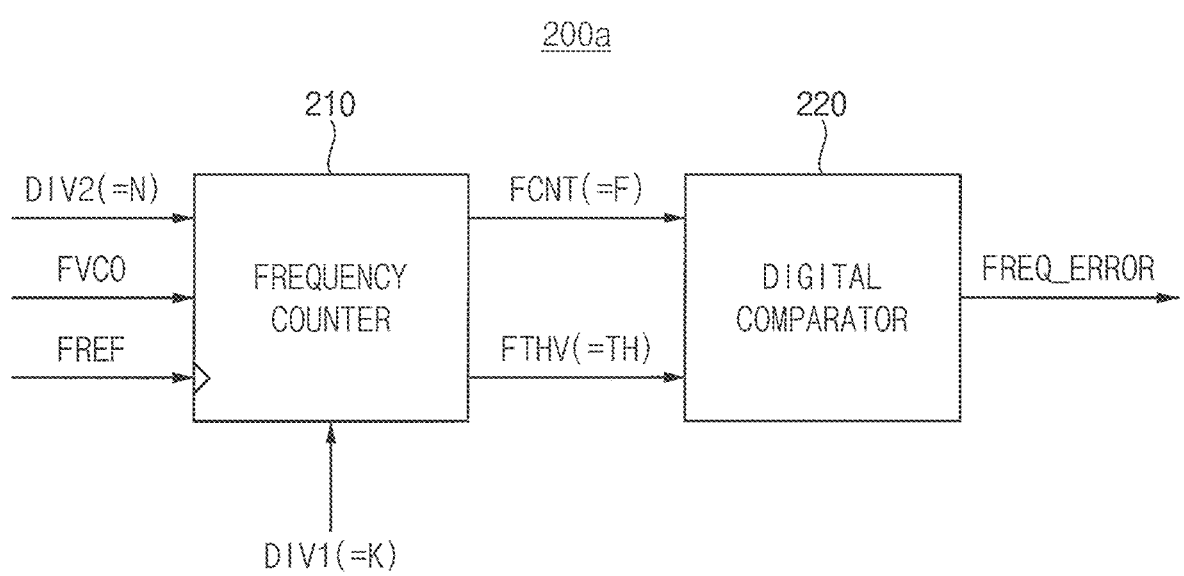
FIGS. 3 and 4 are block diagrams illustrating examples of a frequency error generator included in an automatic frequency calibration and lock detection circuit of FIG. 1.
Figure 4:
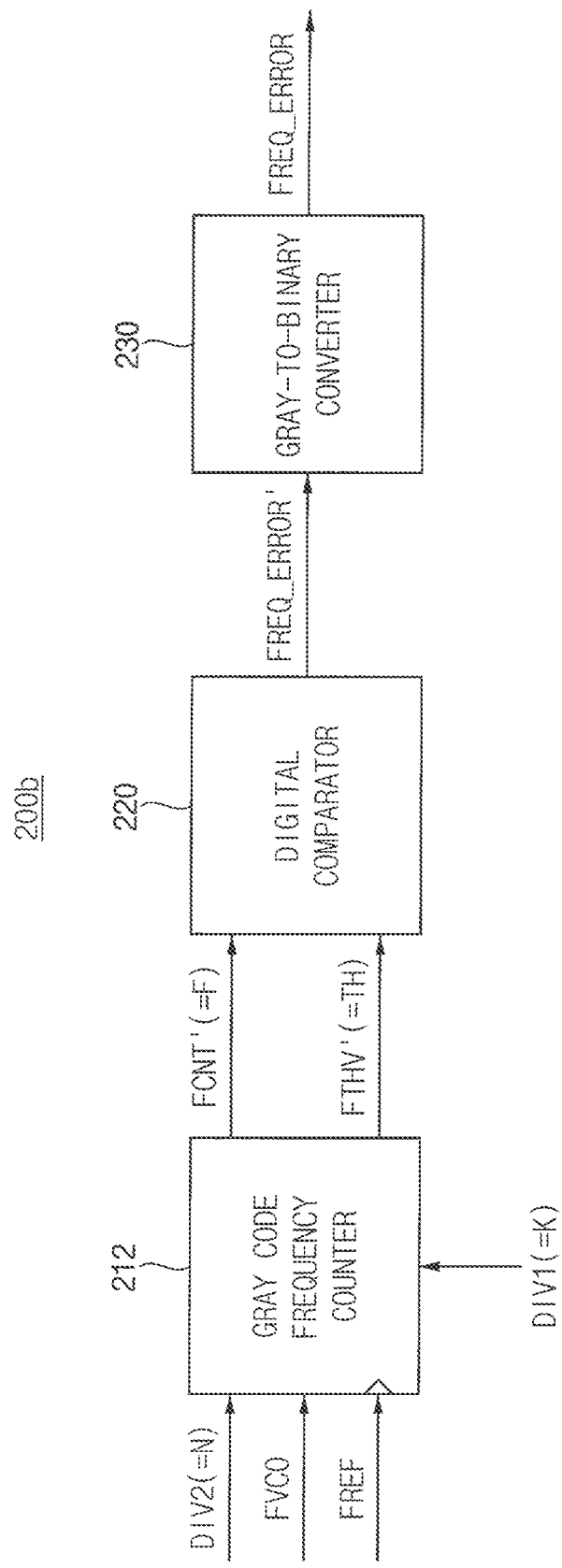

FIGS. 3 and 4 are block diagrams illustrating examples of a frequency error generator included in an automatic frequency calibration and lock detection circuit of FIG. 1.

Referring to FIG. 3, a frequency error generator 200a may include a frequency counter 210 and a digital comparator 220. According to at least some example embodiments of the inventive concepts, each of the frequency counter 210 and digital comparator 220 may be embodied by a circuit and/or circuitry. Accordingly, the frequency counter 210 and digital comparator 220 may also be referred to, in the present specification, as the frequency counter circuit 210 and digital comparator circuit 220, respectively.

The frequency counter 210 may generate a frequency count signal FCNT and a frequency threshold signal FTHV based on the reference frequency signal FREF, the output frequency signal FVCO, the first division control signal DIV1 and the second division control signal DIV2.

The frequency count signal FCNT may represent a count value F for the output frequency signal FVCO. The frequency threshold signal FTHV may represent the target frequency, and may include a frequency threshold value TH that corresponds to the target frequency. For example, each of the frequency count signal FCNT and the frequency threshold signal FTHV may be a digital code.

According to at least some example embodiments of the inventive concepts, the frequency counter 210 may generate the divided reference frequency signal (e.g., FREF/K) by dividing the reference frequency signal FREF based on the first division control signal DIV1, and may generate the frequency count signal FCNT by counting the frequency of the output frequency signal FVCO based on the divided reference frequency signal FREF/K. For example, the frequency counter 210 may generate the frequency count signal FCNT by counting the number of rising edges or falling edges of the output frequency signal FVCO during a time interval between a rising edge and a falling edge included in one period of the divided reference frequency signal FREF/K.

According to at least some example embodiments of the inventive concepts, the frequency threshold value TH that is included in the frequency threshold signal FTHV and corresponds to the target frequency may be determined or set based on the first division control signal DIV1 and the second division control signal DIV2. For example, the frequency threshold value TH may be determined based on the integer K included in the first division control signal DIV1 and the integer N included in the second division control signal DIV2. A detailed scheme of determining the frequency threshold value TH will be described with reference to FIGS. 11A and 11B.

According to at least some example embodiments of the inventive concepts, the frequency threshold value TH may be internally determined by the frequency error generator 200a, and, for example, may be set by the frequency counter 210.

The digital comparator 220 may generate the frequency error signal FREQ_ERROR by comparing the frequency count signal FCNT with the frequency threshold signal FTHV. The frequency error signal FREQ_ERROR may represent a difference between the count value F of the frequency count signal FCNT and the frequency threshold value TH of the frequency threshold signal FTHV.

Referring to FIG. 4, a frequency error generator 200b may include a Gray code frequency counter 212, a digital comparator 220 and a Gray-to-binary converter 230. According to at least some example embodiments of the inventive concepts, each of the Gray code frequency counter 212, digital comparator 220 and Gray-to-binary converter 230 may be embodied by a circuit and/or circuitry. Accordingly, the Gray code frequency counter 212, digital comparator 220 and Gray-to-binary converter 230 may also be referred to, in the present specification, as the Gray code frequency counter circuit 212, digital comparator circuit 220 and Gray-to-binary converter circuit 230, respectively.

The frequency error generator 200b may be the same or substantially the same as the frequency error generator 200a of FIG. 3, except that the frequency counter 210 in FIG. 3 is replaced with the Gray code frequency counter 212 and the frequency error generator 200b further includes the Gray-to-binary converter 230. The descriptions repeated with FIG. 3 will be omitted.

The Gray code frequency counter 212 may generate a frequency count signal FCNT' and a frequency threshold signal FTHV' based on Gray code. An operation of the Gray code frequency counter 212 may be the same or substantially the same as that of the frequency counter 210 in FIG. 3, except that the Gray code frequency counter 212 outputs the frequency count signal FCNT' and the frequency threshold signal FTHV' in the form of Gray code.

The digital comparator 220 may generate a frequency error signal FREQ_ERROR' in the form of Gray code by comparing the frequency count signal FCNT' in the form of Gray code with the frequency threshold signal FTHV' in the form of Gray code.

The Gray-to-binary converter 230 may generate the frequency error signal FREQ_ERROR in the form of general binary code by performing a Gray-to-binary conversion on an output of the digital comparator 220 (e.g., the frequency error signal FREQ_ERROR' in the form of Gray code).

Since Gray code has no weight value, the Gray code may be inappropriate for calculations or computations. However, unlike general binary code, the Gray code may be implemented such that two successive values are different only one bit, data errors may be reduced when the Gray code is used as input/output (I/O) codes.

When a frequency error value is generated using the frequency error generator according to at least some example embodiments of the inventive concepts, clock signals associated with the reference frequency signal FREF and the output frequency signal FVCO may not be synchronized or may be asynchronized with each other, and thus an error due to the unintended glitch may occur. For example, when an output value is transitioned from "$01111_{(2)}$" to "$10000_{(2)}$", all bits may be changed from "0" to "1" or from "1" to "0", and thus an instantaneous error may occur if the skew exists between the bits.

To reduce or prevent the occurrence of such error, the frequency count signal FCNT' in the form of Gray code may be generated using the Gray code frequency counter 212. When a counting operation is performed on the output frequency signal FVCO, a count value may increase in the form of Gray code, and thus the glitch that occurs due to the skew between the bits while increasing the count value may be reduced or prevented because only one bit is always changed in count value. Therefore, the glitch may not be captured even if the count value is latched at any random moment. In addition, the Gray-to-binary converter 230 may be disposed at an output stage of the digital comparator 220, and the frequency error signal FREQ_ERROR that is finally output may be provided to the automatic frequency calibration signal generator 300 and the lock flag generator 400 in the form of general binary code.

Figure 5:
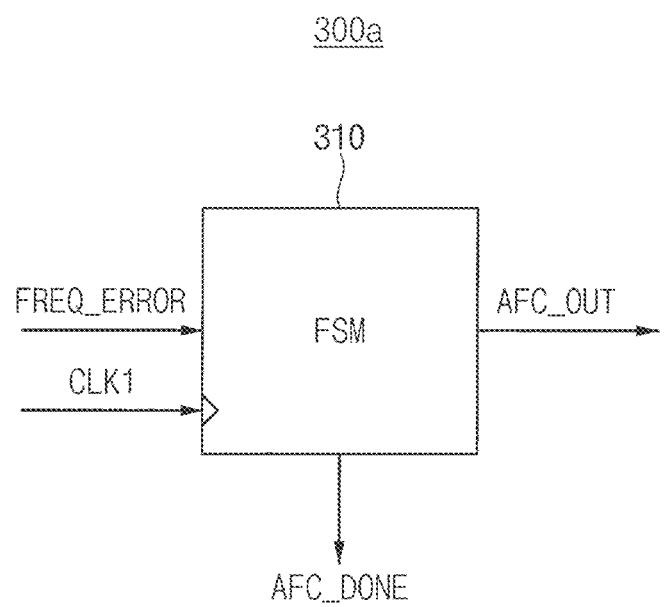
FIGS. 5 and 6 are block diagrams illustrating examples of an automatic frequency calibration signal generator included in an automatic frequency calibration and lock detection circuit of FIG. 1.
Figure 6:
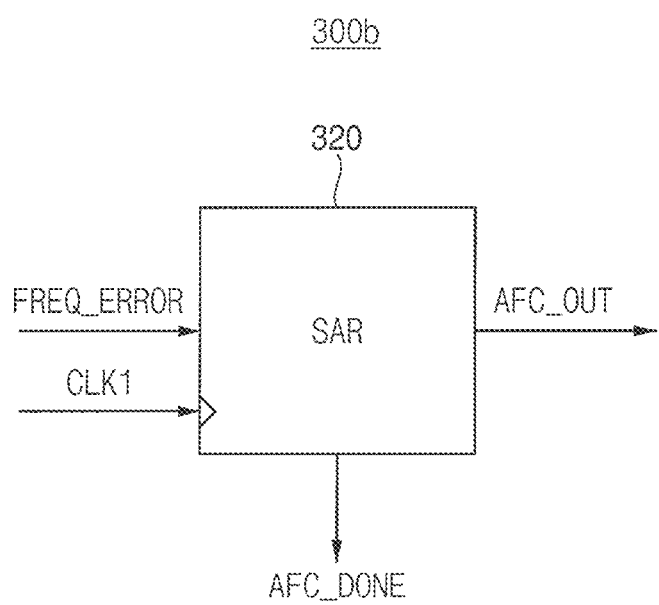

FIGS. 5 and 6 are block diagrams illustrating examples of an automatic frequency calibration signal generator included in an automatic frequency calibration and lock detection circuit of FIG. 1.

Referring to FIG. 5, an automatic frequency calibration signal generator 300a may include a finite state machine (FSM) 310. According to at least some example embodiments of the inventive concepts, the FSM 310 may be embodied by a circuit and/or circuitry. Accordingly, the FSM 310 may also be referred to, in the present specification, as the FSM circuit 310.

The finite state machine 310 may generate the automatic frequency calibration output signal AFC_OUT and the automatic frequency calibration done signal AFC_DONE based on the frequency error signal FREQ_ERROR and the first clock signal CLK1.

For example, the finite state machine 310 may perform the first calibration operation for changing the automatic frequency calibration output signal AFC_OUT such that a value of the frequency error signal FREQ_ERROR, e.g., the difference between the frequency of the output frequency signal FVCO and the target frequency, converges to zero. The number of capacitors that are enabled among the plurality of capacitors included in the capacitor bank array may be adjusted based on the automatic frequency calibration output signal AFC_OUT.

In addition, when the first calibration operation is completed, e.g., when the output frequency signal FVCO has the first frequency close to the target frequency, the finite state machine 310 may activate the automatic frequency calibration done signal AFC_DONE.

Referring to FIG. 6, an automatic frequency calibration signal generator 300b may include a successive approximation register (SAR) 320. According to at least some example embodiments of the inventive concepts, the SAR 320 may be embodied by a circuit and/or circuitry. Accordingly, the SAR 320 may also be referred to, in the present specification, as the SAR circuit 320.

The successive approximation register 320 may generate the automatic frequency calibration output signal AFC_OUT and the automatic frequency calibration done signal AFC_DONE based on the frequency error signal FREQ_ERROR and the first clock signal CLK1.

For example, the successive approximation register 320 may perform the first calibration operation by performing a binary search algorithm based on the frequency error signal FREQ_ERROR. For example, the algorithm may be repeatedly performed (e.g., a loop may be repeatedly performed) until a least significant bit (LSB) of the automatic frequency calibration output signal AFC_OUT is determined. When the LSB of the automatic frequency calibration output signal AFC_OUT is determined, it may be determined that the first calibration operation is completed, and the automatic frequency calibration done signal AFC_DONE may be activated.

In computer science, binary search, also known as half-interval search, logarithmic search, or binary chop, is a search algorithm that finds the position of a target value within a sorted array. In binary search, the target value may be compared to the middle element of the array. If they are not equal, the half in which the target cannot lie is eliminated and the search continues on the remaining half, again taking the middle element to compare to the target value, and repeating this until the target value is found. If the search ends with the remaining half being empty, the target is not in the array.

Figure 7:
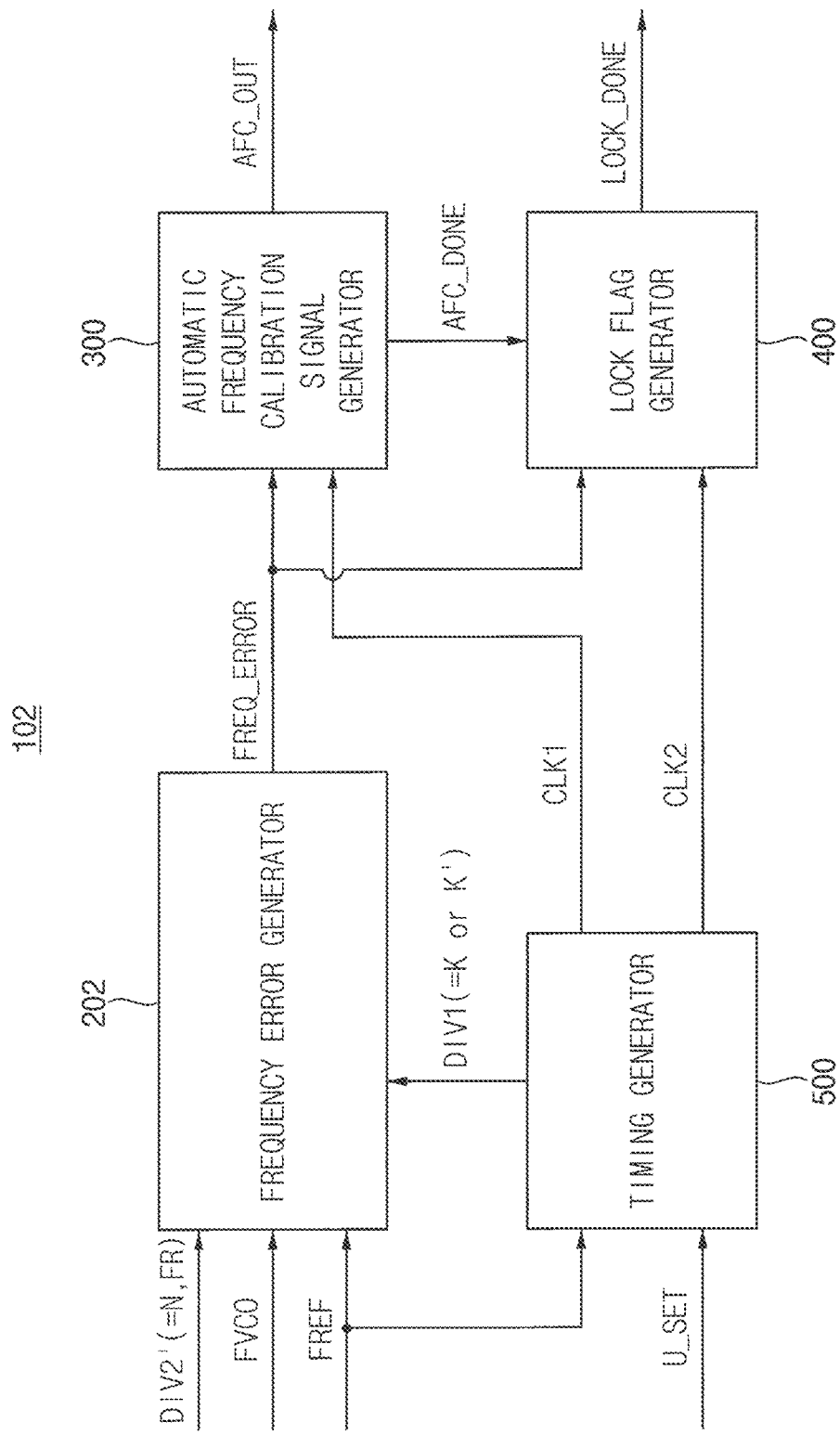
FIG. 7 is a block diagram illustrating an automatic frequency calibration and lock detection circuit according to at least some example embodiments of the inventive concepts.

FIG. 7 is a block diagram illustrating an automatic frequency calibration and lock detection circuit according to at least some example embodiments of the inventive concepts. The descriptions repeated with FIG. 1 will be omitted.

Referring to FIG. 7, an automatic frequency calibration and lock detection circuit 102 includes a frequency error generator 202, an automatic frequency calibration signal generator 300, and a lock flag generator 400. As is discussed above with respect to the frequency error generator 200, according to at least some example embodiments of the inventive concepts, the frequency error generator 202 may be embodied by a circuit and/or circuitry, and thus, may also be referred to, in the present specification, as the frequency error generator circuit 202. The automatic frequency calibration and lock detection circuit 102 may further include a timing generator 500.

The automatic frequency calibration and lock detection circuit 102 may be the same or substantially the same as the automatic frequency calibration and lock detection circuit 100 of FIG. 1, except that a configuration of the frequency error generator 202 is partially changed.

The frequency error generator 202 generates the frequency error signal FREQ_ERROR based on the reference frequency signal FREF, the output frequency signal FVCO, the first division control signal DIV1 and a second division control signal DIV2'.

The second division control signal DIV2' may include an integer N and a fraction (or decimal) FR. The second division control signal DIV2' may be the same or substantially the same as a division control signal that is used in a phase locked loop including the automatic frequency calibration and lock detection circuit 102. In other words, the phase locked loop including the automatic frequency calibration and lock detection circuit 102 may be a fractional-N phase locked loop.

Figure 8:
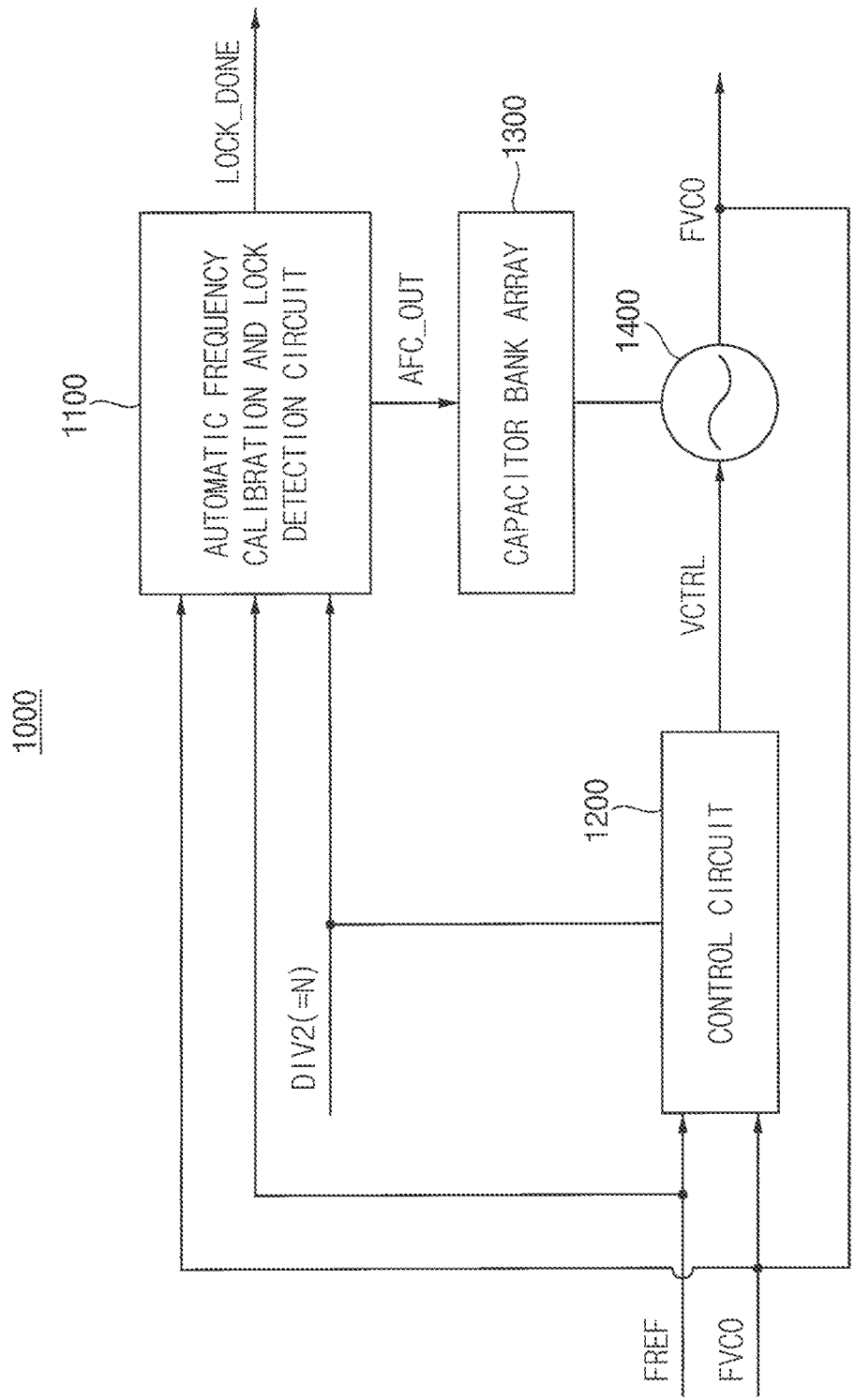
FIG. 8 is a block diagram illustrating a phase locked loop according to at least some example embodiments of the inventive concepts.

FIG. 8 is a block diagram illustrating a phase locked loop according to at least some example embodiments of the inventive concepts.

Referring to FIG. 8, a phase locked loop 1000 includes an automatic frequency calibration and lock detection circuit 1100, a control circuit 1200, a capacitor bank array 1300, and a voltage controlled oscillator (VCO) 1400. According to at least some example embodiments of the inventive concepts, the VCO 1400 may be embodied by a circuit and/or circuitry, and thus, the VCO 1400 may also be referred to, in the present specification, as the VCO circuit 1400.

The automatic frequency calibration and lock detection circuit 1100 generates an automatic frequency calibration output signal AFC_OUT, an automatic frequency calibration done signal AFC_DONE and a lock done signal LOCK_DONE based on a reference frequency signal FREF, an output frequency signal FVCO, a first division control signal DIV1 and a second division control signal DIV2.

The automatic frequency calibration and lock detection circuit 1100 may be the automatic frequency calibration and lock detection circuit according to at least some example embodiments of the inventive concepts, and may be, for example, the automatic frequency calibration and lock detection circuit 100 of FIG. 1.

As described with reference to FIG. 1, the automatic frequency calibration output signal AFC_OUT represents a result of a first calibration operation on the output frequency signal FVCO, the automatic frequency calibration done signal AFC_DONE represents the completion of the first calibration operation, and the lock done signal LOCK_DONE represents a completion of a second calibration operation on the output frequency signal FVCO. The first division control signal DIV1 and the automatic frequency calibration done signal AFC_DONE may be internally generated and used by the automatic frequency calibration and lock detection circuit 1100.

In an example of FIG. 8, the second division control signal DIV2 may include an integer N, and may be a division control signal that is used in the control circuit 1200. Thus, the phase locked loop 1000 may be an integer-N phase locked loop.

The control circuit 1200 generates a voltage control signal VCTRL based on the reference frequency signal FREF, the output frequency signal FVCO and the second division control signal DIV2. The voltage control signal VCTRL represents a result of the second calibration operation. The voltage controlled oscillator 1400 may finely adjust the frequency of the output frequency signal FVCO based on the voltage control signal VCTRL. A detailed configuration of the control circuit 1200 will be described with reference to FIG. 10.

The capacitor bank array 1300 is connected to the voltage controlled oscillator 1400, and at least a part of the capacitor bank array 1300 is selectively enabled based on the automatic frequency calibration output signal AFC_OUT. The voltage controlled oscillator 1400 may coarsely adjust the frequency of the output frequency signal FVCO based on the capacitor bank array 1300. A detailed configuration of the capacitor bank array 1300 will be described with reference to FIG. 9.

The voltage controlled oscillator 1400 generates the output frequency signal FVCO based on the capacitor bank array 1300 and the voltage control signal VCTRL, and adjusts the output frequency signal FVCO to have the target frequency.

According to at least some example embodiments of the inventive concepts, the automatic frequency calibration and lock detection circuit 1100, the capacitor bank array 1300 and the voltage controlled oscillator 1400 may form a first loop that performs the first calibration operation (e.g., a coarse calibration operation). According to at least some example embodiments of the inventive concepts, the control circuit 1200 and the voltage controlled oscillator 1400 may form a second loop that performs the second calibration operation (e.g., a fine calibration operation).

The phase locked loop 1000 according to at least some example embodiments of the inventive concepts may include the automatic frequency calibration and lock detection circuit 1100 in which the frequency error generator 200 is shared by the automatic frequency calibration signal generator 300 performing the automatic frequency calibration function and the lock flag generator 400 performing the lock detection function. Accordingly, the phase locked loop

1000 may be efficiently implemented such that the phase locked loop 1000 performs the same performance and function with the reduced circuit area.

For example, the size of the frequency error generator 200 may be proportional to the number of flip-flops included in the frequency error generator 200, and the number of flip-flops may be determined depending on the number of bits representing the frequency error (e.g., depending on the frequency error resolution). For example, if the frequency error generator 200 is designed with a resolution of 14 bits, 14 flip-flops may be used for the counter, 2*14 flip-flops may be used for the capture, 14 flip-flops may be used for the digital comparator, and thus the frequency error generator 200 may include a total of 56 flip-flops. When the automatic frequency calibration and lock detection circuit 1100 is implemented according to at least some example embodiments of the inventive concepts and the frequency error generator 200 is designed with a resolution of 14 bits, 56 flip-flops may be reduced in a single phase locked loop intellectual property (IP), because the frequency error generator 200 is shared by the automatic frequency calibration signal generator 300 and the lock flag generator 400.

In addition, as will be described with reference to FIG. 19, the phase locked loop 1000 according to at least some example embodiments of the inventive concepts may be included in a radio frequency (RF) chip or a radio frequency integrated circuit (RFIC). Typically, the RF chip (or RFIC) may include various functional blocks such as Bluetooth, Wireless Fidelity (WiFi), baseband, global navigation satellite system (GNSS), or the like, each of the functional blocks may include a respective one of local oscillators (LOs) having different frequencies, a separate phase locked loop may be used for each local oscillator, and thus the RF chip may include a plurality of (e.g., several or dozens of) phase locked loops. Therefore, when the phase locked loop 1000 according to at least some example embodiments of the inventive concepts is applied or employed to the RF chip (or RFIC), a plurality of (e.g., hundreds of) flip-flops may be removed as compared to a conventional RF chip, so the RF chip may have the reduced size or area.

Figure 9:
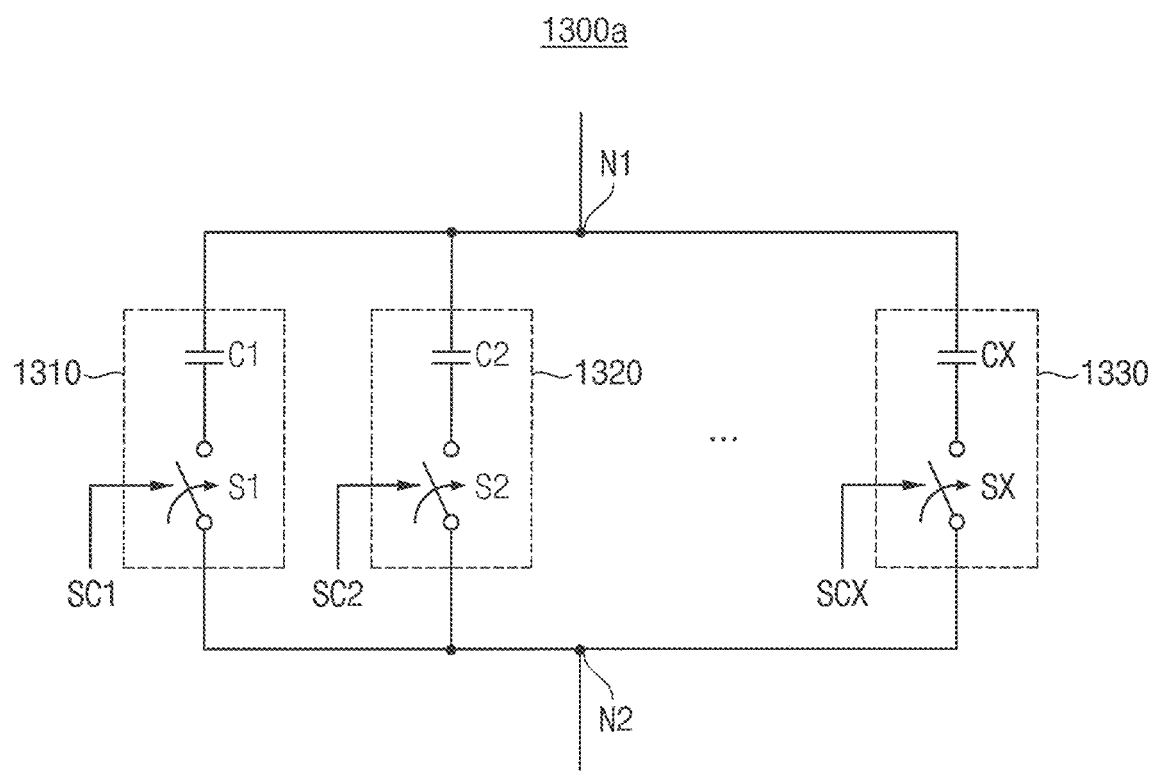
FIG. 9 is a circuit diagram illustrating an example of a capacitor bank array included in a phase locked loop of FIG. 8.

FIG. 9 is a circuit diagram illustrating an example of a capacitor bank array included in a phase locked loop of FIG. 8.

Referring to FIG. 9, a capacitor bank array 1300a may include a plurality of capacitor circuits 1310, 1320 and 1330. The plurality of capacitor circuits 1310, 1320 and 1330 may be connected in parallel between a first node N1 and a second node N2.

Each of the plurality of capacitor circuits 1310, 1320 and 1330 may include at least one capacitor and at least one switch that are connected in series between the first node N1 and the second node N2.

For example, the first capacitor circuit 1310 may include a first capacitor C1 and a first switch S1 that is turned on or off based on a first switch control signal SC1. The second capacitor circuit 1320 may include a second capacitor C2 and a second switch S2 that is turned on or off based on a second switch control signal SC2. The X-th capacitor circuit 1330 may include an X-th capacitor CX and an X-th switch SX that is turned on or off based on an X-th switch control signal SCX, where X is a positive integer greater than or equal to two. However, at least some example embodiments of the inventive concepts are not limited thereto, and the number of capacitors and switches may be variously changed according to at least some example embodiments of the inventive concepts.

According to at least some example embodiments of the inventive concepts, the switch control signals SC1, SC2 and SCX may be the same or substantially the same as the automatic frequency calibration output signal AFC_OUT. According to at least some other example embodiments of the inventive concepts, the switch control signals SC1, SC2 and SCX may be control signals generated based on the automatic frequency calibration output signal AFC_OUT.

As described with reference to FIG. 8, the capacitor bank array 1300a may be connected to the voltage controlled oscillator 1400, and thus at least one of the first node N1 and the second node N2 may be connected to the voltage controlled oscillator 1400. For example, the first node N1 may be connected to an oscillation node included in the voltage controlled oscillator 1400, and the second node N2 may be connected to a ground voltage, but at least some example embodiments of the inventive concepts are not limited thereto.

The plurality of capacitor circuits 1310, 1320 and 1330 may be enabled or disabled by turning on or off the switches S1, S2 and SX based on the automatic frequency calibration output signal AFC_OUT (e.g., based on the switch control signals SC1, SC2 and SCX). For example, when all of the switches S1, S2 and SX are turned on, all of the capacitor circuits 1310, 1320 and 1330 and all of the capacitors C1, C2 and CX included in the capacitor circuits 1310, 1320 and 1330 may be enabled (e.g., all of the capacitor circuits 1310, 1320 and 1330 and all of the capacitors C1, C2 and CX may be electrically connected to the voltage controlled oscillator 1400). The voltage controlled oscillator 1400 may generate and/or adjust the output frequency signal FVCO based on the number of capacitor circuits and/or capacitors that are enabled.

Figure 10:
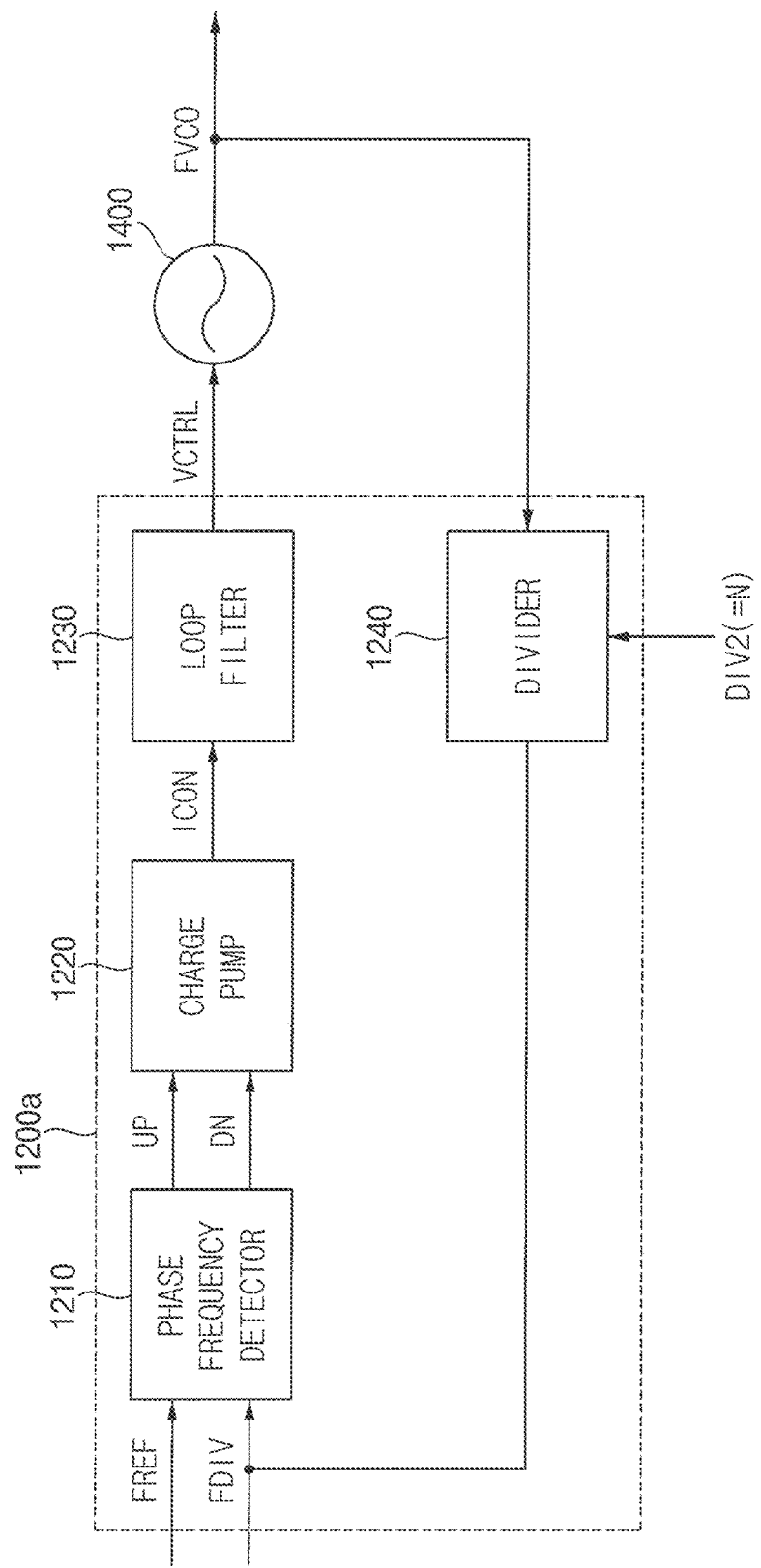
FIG. 10 is a block diagram illustrating an example of a control circuit included in a phase locked loop of FIG. 8.

FIG. 10 is a block diagram illustrating an example of a control circuit included in a phase locked loop of FIG. 8.

Referring to FIG. 10, a control circuit 1200a may include a phase frequency detector 1210, a charge pump 1220, a loop filter 1230 and a divider 1240. According to at least some example embodiments of the inventive concepts, each of the phase frequency detector 1210, charge pump 1220, loop filter 1230 and divider 1240 may be embodied by a circuit and/or circuitry. Accordingly, the phase frequency detector 1210, charge pump 1220, loop filter 1230 and divider 1240 may also be referred to, in the present specification, as the phase frequency detector circuit 1210, charge pump circuit 1220, loop filter circuit 1230 and divider circuit 1240, respectively.

The phase frequency detector 1210 may generate a phase detection signal based on the reference frequency signal FREF and a divided output frequency signal FDIV.

The divided output frequency signal FDIV may be a feedback frequency signal from which the output frequency signal FVCO output from the voltage controlled oscillator 1400 is fed back. The reference frequency signal FREF may be generated, e.g., by a crystal oscillator that uses a crystal material, and may have a fixed frequency. Thus, a frequency of the reference frequency signal FREF may be used as a reference frequency (e.g., the target frequency) for a frequency of the divided output frequency signal FDIV.

According to at least some example embodiments of the inventive concepts, the phase detection signal may include a first phase detection signal UP and a second phase detection signal DN. For example, when a phase of the divided output frequency signal FDIV lags behind a phase of the reference frequency signal FREF, the phase frequency detector 1210 may generate the first phase detection signal UP for adjusting a phase of the output frequency signal FVCO toward a first direction. For example, when the phase of the divided output frequency signal FDIV leads the phase of the reference frequency signal FREF, the phase frequency detector 1210 may generate the second phase detection signal DN for adjusting the phase of the output frequency signal FVCO toward a second direction opposite to the first direction.

According to at least some example embodiments of the inventive concepts, the phase frequency detector 1210 may be implemented as a bang-bang phase frequency detector, but at least some example embodiments of the inventive concepts are not limited thereto.

The charge pump 1220 may generate a control current ICON based on the phase detection signal, and may provide the control current ICON to the loop filter 1230.

According to at least some example embodiments of the inventive concepts, the charge pump 1220 may source a current (e.g. the control current ICON) output from a power supply to an output terminal, or may sink a current from the output terminal to a ground, based on the phase detection signal. For example, when the phase frequency detector 1210 outputs the first phase detection signal UP, the charge pump 1220 may source the current output from the power supply to the loop filter 1230. For example, when the phase frequency detector 1210 outputs the second phase detection signal DN, the charge pump 1220 may sink a current from the loop filter 1230 to the ground.

The loop filter 1230 may generate the voltage control signal VCTRL based on the control current ICON, and may maintain the voltage control signal VCTRL to a constant voltage level.

According to at least some example embodiments of the inventive concepts, the loop filter 1230 may increase an output voltage (e.g., the voltage control signal VCTRL) based on a sourced current, or may decrease the output voltage based on a sunk current. For example, the loop filter 1230 may generate a voltage varying based on the sourced or sunk current. For example, the loop filter 1230 may eliminate the jitter by removing the glitch from the current output from the charge pump 1220 and by reducing or preventing the voltage overshoot.

According to at least some example embodiments of the inventive concepts, the charge pump 1220 may include the loop filter 1230. In this example, the charge pump 1220 may generate the voltage control signal VCTRL varying based on the phase detection signal.

The voltage controlled oscillator 1400 may generate the output frequency signal FVCO that has a phase and a frequency corresponding to the voltage control signal VCTRL.

The divider 1240 may generate the divided output frequency signal FDIV by dividing the output frequency signal FVCO based on the second division control signal DIV2. For example, the divider 1240 may generate the divided output frequency signal FDIV by dividing the output frequency signal FVCO by N based on the integer N in the second division control signal DIV2. For example, the divider 1240 may be referred to as an integer-N divider.

Figure 11A:
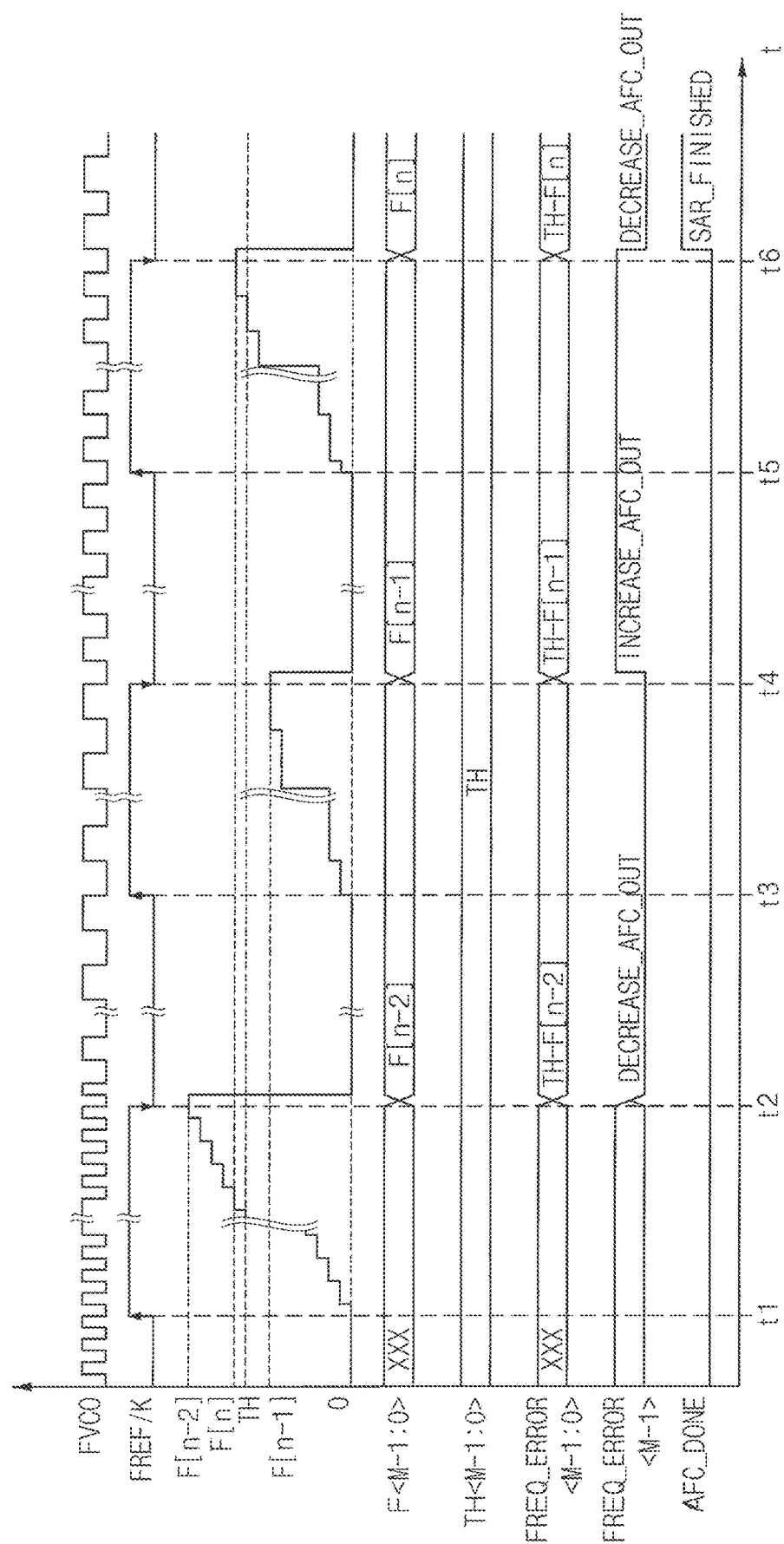
FIGS. 11A and 11B are diagrams for describing an operation of a phase locked loop of FIG. 8.
Figure 11B:
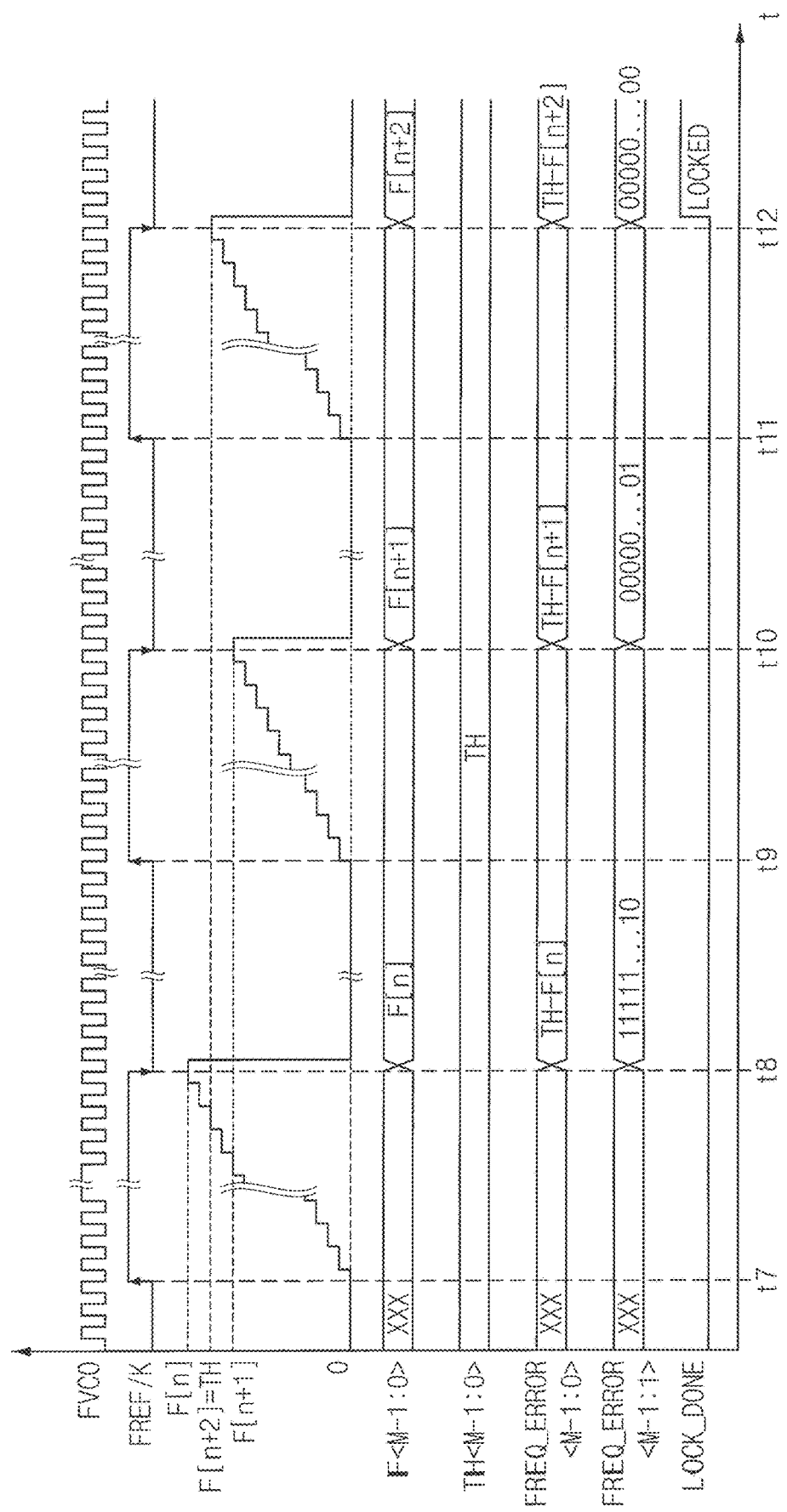

FIGS. 11A and 11B are diagrams for describing an operation of a phase locked loop of FIG. 8.

In FIGS. 11A and 11B, "FVCO" represents the output frequency signal, and "FREF/K" represents the divided reference frequency signal obtained by dividing the reference frequency signal by K. "F<M−1:0>" represents a digital code of M bits corresponding to the frequency count signal FCNT, "TH<M−1:0>" represents a digital code of M bits corresponding to the frequency threshold signal FTHV, and "FREQ_ERROR<M−1:0>" represents a digital code of M bits corresponding to the frequency error signal FREQ_ERROR, where M is a positive integer. "TH" represents the frequency threshold value included in the frequency threshold signal FTHV, and each of "F[n−2]", "F[n−1]", "F[n]", "F[n+1]" and "F[n+2]" represents the count value that is included in the frequency count signal FCNT and corresponds to the result of the counting operation.

Referring to FIG. 11A, a process of performing the first calibration operation (e.g., the coarse calibration operation or the automatic frequency calibration operation) is illustrated when the automatic frequency calibration signal generator 300 includes the successive approximation register 320 in FIG. 6.

The integer K, which is a division value for the reference frequency signal FREF, may be a value that is preset (or set in advance) by a designer. Before the first calibration operation is performed, the frequency threshold value TH may be determined or set based on Equation 1 and Equation 2, e.g., based on the integer K in the first division control signal DIV1 and the integer N in the second division control signal DIV2. In addition, since the frequency error signal FREQ_ERROR should include the frequency threshold value TH and should be implemented to express a sign (e.g., + or −), a code length (e.g., M) of the frequency error signal FREQ_ERROR may be determined to satisfy a condition in Equation 3.

$$\frac{1/2}{FREF/K} = \frac{TH}{FVCO} \qquad \text{[Equation 1]}$$

$$\therefore TH = \frac{K}{2} \cdot \frac{FVCO}{FREF} = \frac{K \cdot N}{2} \qquad \text{[Equation 2]}$$

$$2^{M-1} > \frac{K \cdot N}{2} \qquad \text{[Equation 3]}$$

To perform the binary search using the successive approximation register 320, a loop for obtaining a count value and a frequency error value may be performed by counting the number of rising edges of the output frequency signal FVCO during a half of a period of the divided reference frequency signal FREF/K. The loop may be repeatedly performed until the LSB of the automatic frequency calibration output signal AFC_OUT is determined. In FIG. 11A, an (n−2)-th loop, an (n−1)-th loop and an n-th loop (e.g., a final loop) are illustrated as examples, where n is a positive integer greater than or equal to three.

For example, in the (n−2)-th loop, the count value F[n−2] may be obtained by counting the number of rising edges of the output frequency signal FVCO during a time interval between a rising edge and a falling edge (e.g., from a time point t1 to a time point t2) that corresponds to a half of the period of the divided reference frequency signal FREF/K, and a frequency error value TH−F[n−2] that represents a difference between the frequency threshold value TH and the count value F[n−2] may be obtained. The count value F[n−2] may be greater than the frequency threshold value TH, and thus it may be checked that the frequency of the output frequency signal FVCO is higher than the target frequency. Therefore, a value of "DECREASE_AFC_OUT" may be generated, and the value of the automatic frequency calibration output signal AFC_OUT and the frequency of the output frequency signal FVCO may decrease based on the value of "DECREASE_AFC_OUT". In addition, the LSB of the automatic frequency calibration output signal AFC_OUT may not be determined yet, and thus the automatic frequency calibration done signal AFC_DONE may be deactivated.

After that, in the (n−1)-th loop, the count value F[n−1] may be obtained by counting the number of rising edges of the output frequency signal FVCO during a time interval between a rising edge and a falling edge (e.g., from a time point t3 to a time point t4) that corresponds to a half of the period of the divided reference frequency signal FREF/K, and a frequency error value TH−F[n−1] that represents a difference between the frequency threshold value TH and the count value F[n−1] may be obtained. The count value F[n−1] may be smaller than the frequency threshold value TH, and thus it may be checked that the frequency of the output frequency signal FVCO is lower than the target frequency. Therefore, a value of "INCREASE_AFC_OUT" may be generated, and the value of the automatic frequency calibration output signal AFC_OUT and the frequency of the output frequency signal FVCO may increase based on the value of "INCREASE_AFC_OUT". In addition, as with the (n−2)-th loop, the LSB of the automatic frequency calibration output signal AFC_OUT may not be determined yet, and thus the automatic frequency calibration done signal AFC_DONE may be deactivated.

After that, in the n-th loop, the count value F[n] may be obtained by counting the number of rising edges of the output frequency signal FVCO during a time interval between a rising edge and a falling edge (e.g., from a time point t5 to a time point t6) that corresponds to a half of the period of the divided reference frequency signal FREF/K, and a frequency error value TH−F[n] that represents a difference between the frequency threshold value TH and the count value F[n] may be obtained. The count value F[n] may be greater than the frequency threshold value TH, and thus it may be checked that the frequency of the output frequency signal FVCO is higher than the target frequency. Therefore, a value of "DECREASE_AFC_OUT" may be generated, and the value of the automatic frequency calibration output signal AFC_OUT and the frequency of the output frequency signal FVCO may decrease based on the value of "INCREASE_AFC_OUT". In addition, unlike the (n−2)-th loop and the (n−1)-th loop, the LSB of the automatic frequency calibration output signal AFC_OUT may be determined. As a result, the automatic frequency calibration done signal AFC_DONE may be activated, and the first calibration operation may be completed as illustrated by "SAR_FINISHED".

Referring to FIG. 11B, a process of performing the lock detection operation is illustrated when the second calibration operation (e.g., the fine calibration operation) is performed after the first calibration operation is completed. FIG. 11B illustrates an example where K'=K.

As with that described with reference to FIG. 11A, to perform the lock detection operation, a loop for obtaining a count value and a frequency error value may be performed by counting the number of rising edges of the output frequency signal FVCO during a half of the period of the divided reference frequency signal FREF/K. The loop may be repeatedly performed until the count value becomes equal to the frequency threshold value TH. In FIG. 11B, an (n+1)-th loop, an (n+2)-th loop and an (n+3)-th loop that are performed subsequent to the n-th loop in FIG. 11A are illustrated as examples.

For example, in the (n+1)-th loop, the count value F[n] may be obtained by counting the number of rising edges of the output frequency signal FVCO during a time interval between a rising edge and a falling edge (e.g., from a time point t7 to a time point t8) that corresponds to a half of the period of the divided reference frequency signal FREF/K, and the frequency error value TH−F[n] that represents the difference between the frequency threshold value TH and the count value F[n] may be obtained. For example, the count value F[n] in the (n+1)-th loop may be the same or substantially the same as the count value F[n] in the n-th loop. The frequency error value TH−F[n], e.g., "FREQ_ERROR<M−1:1>" that represents from a most significant bit (MSB) to a second bit of the frequency error signal FREQ_ERROR may have a value of "11111 . . . 10". It may be checked that the count value F[n] is not yet become equal to the frequency threshold value TH, and thus the lock done signal LOCK_DONE may be deactivated.

After that, in the (n+2)-th loop, the count value F[n+1] may be obtained by counting the number of rising edges of the output frequency signal FVCO during a time interval between a rising edge and a falling edge (e.g., from a time point t9 to a time point t10) that corresponds to a half of the period of the divided reference frequency signal FREF/K, and a frequency error value TH−F[n+1] that represents the difference between the frequency threshold value TH and the count value F[n+1] may be obtained. The frequency error value TH−F[n+1], e.g., "FREQ_ERROR<M−1:1>" may have a value of "00000 . . . 01". As with the (n+1)-th loop, it may be checked that the count value F[n+1] is not yet become equal to the frequency threshold value TH, and thus the lock done signal LOCK_DONE may be deactivated.

After that, in the (n+3)-th loop, the count value F[n+2] may be obtained by counting the number of rising edges of the output frequency signal FVCO during a time interval between a rising edge and a falling edge (e.g., from a time point t11 to a time point t12) that corresponds to a half of the period of the divided reference frequency signal FREF/K, and a frequency error value TH−F[n+2] that represents the difference between the frequency threshold value TH and the count value F[n+2] may be obtained. The frequency error value TH−F[n+2], e.g., "FREQ_ERROR<M−1:1>" may have a value of "00000 . . . 00", and thus it may be checked that the count value F[n+2] becomes equal to the frequency threshold value TH. Therefore, the lock done signal LOCK_DONE may be activated, the lock detection operation may be completed as illustrated by "LOCKED", and the second calibration operation may be completed.

According to at least some example embodiments of the inventive concepts, when all bits of "FREQ_ERROR<M−1:1>" that represents from the MSB to the second bit of the frequency error signal FREQ_ERROR are "1" or "0", e.g., when the frequency error value becomes "−2", "−1", "0" or "1", it may be determined that the second calibration operation and the lock detection operation are completed, and the lock done signal LOCK_DONE may be activated.

In the phase locked loop 1000 according to at least some example embodiments of the inventive concepts, the frequency error value of the output frequency signal FVCO that is finally locked may be determined based on the integer K. For example, the frequency error value may be determined to satisfy Equation 4.

$$\text{Max. frequency error} = \frac{-2}{TH} \times \text{target frequency} = -\frac{4}{K \cdot N} \times \text{target frequency} \quad [\text{Equation 4}]$$

The integer N may be determined by the specification of the phase locked loop 1000, and may not be changed once it is determined. According to Equation 4, when the integer K that is set by the designer increases, the frequency error value may decrease. In addition, the output frequency signal FVCO may be counted during K times the period of the reference frequency signal FREF, and thus the lock time may increase when the integer K increases. Further, the condition in Equation 3 should be satisfied for the circuit implementation, the integer M corresponding to the code length of the frequency error signal FREQ_ERROR may increase when the integer K increases, and thus the number of flip-flops and the circuit area may also increase. In a conventional art where each of the automatic frequency calibration circuit and the lock detection circuit includes the frequency error generator, the number of flip-flops may increase by two whenever the integer M increases by one. When the automatic frequency calibration and lock detection circuit 100 is implemented according to at least some example embodiments of the inventive concepts such that the frequency error generator 200 is shared by the automatic frequency calibration signal generator 300 and the lock flag generator 400, the number of flip-flops may increase by one whenever the integer M increases by one. Accordingly, the phase locked loop that requires the high frequency accuracy may be implemented with the area-efficient structure.

Figure 12:
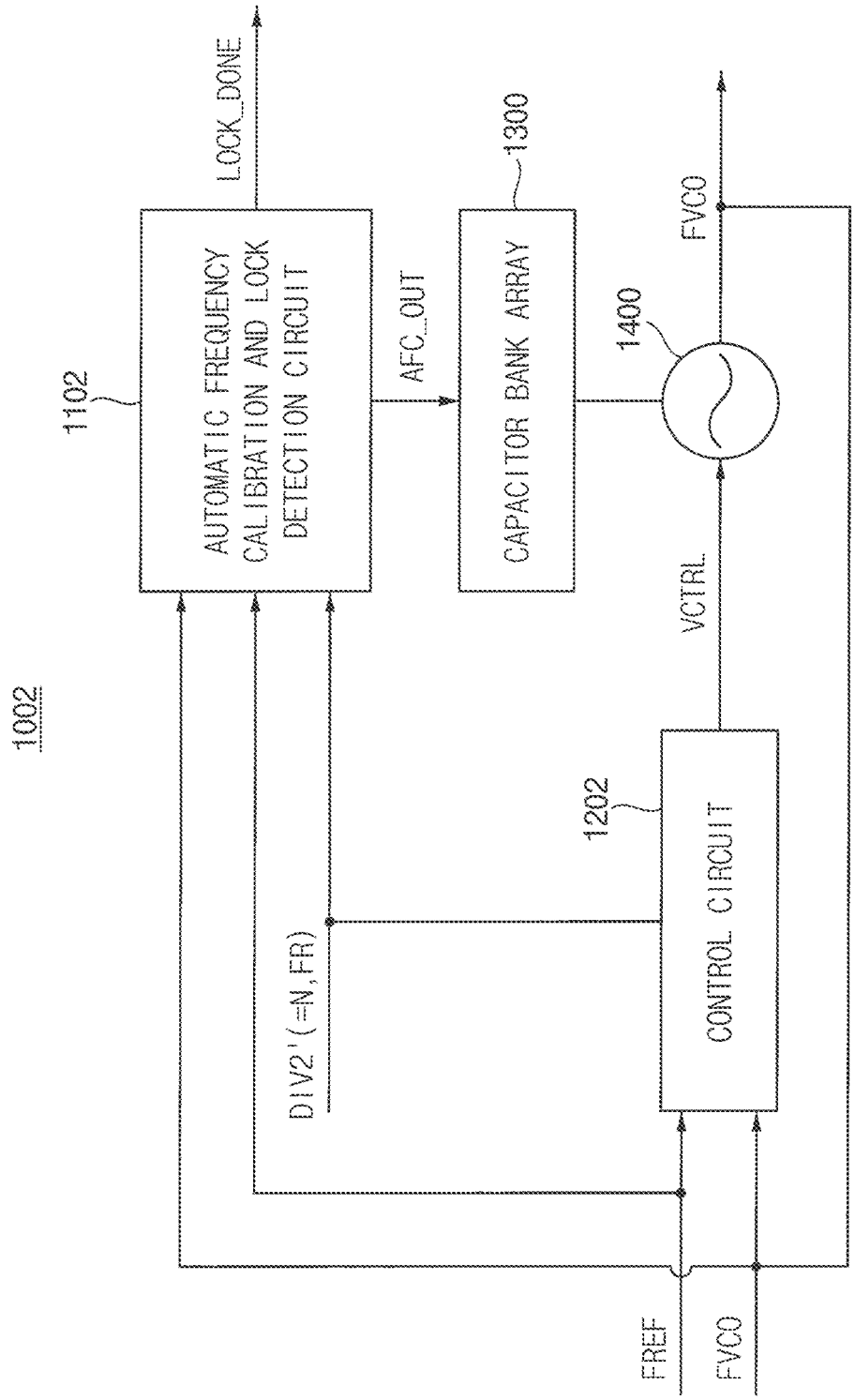
FIG. 12 is a block diagram illustrating a phase locked loop according to at least some example embodiments of the inventive concepts.

FIG. 12 is a block diagram illustrating a phase locked loop according to at least some example embodiments of the inventive concepts. The descriptions repeated with FIG. 8 will be omitted.

Referring to FIG. 12, a phase locked loop 1002 includes an automatic frequency calibration and lock detection circuit 1102, a control circuit 1202, a capacitor bank array 1300, and a voltage controlled oscillator 1400.

The phase locked loop 1002 may be the same or substantially the same as the phase locked loop 1000 of FIG. 8, except that configurations of the automatic frequency calibration and lock detection circuit 1102 and the control circuit 1202 are partially changed.

The automatic frequency calibration and lock detection circuit 1102 generates an automatic frequency calibration output signal AFC_OUT, an automatic frequency calibration done signal AFC_DONE and a lock done signal LOCK_DONE based on a reference frequency signal FREF, an output frequency signal FVCO, a first division control signal DIV1 and a second division control signal DIV2'.

The automatic frequency calibration and lock detection circuit 1102 may be the automatic frequency calibration and lock detection circuit according to at least some example embodiments of the inventive concepts, and may be, for example, the automatic frequency calibration and lock detection circuit 102 of FIG. 7.

In an example of FIG. 12, the second division control signal DIV2' may include an integer N and a fraction FR, and may be a division control signal that is used in the control circuit 1202. Thus, the phase locked loop 1002 may be a fractional-N phase locked loop.

According to at least some example embodiments of the inventive concepts, if the phase locked loop 1002 is a fractional-N phase locked loop, both the integer N and the fraction FR may be used together when the frequency threshold value TH is determined based on Equation 1 and Equation 2.

The control circuit 1202 generates a voltage control signal VCTRL based on the reference frequency signal FREF, the output frequency signal FVCO and the second division control signal DIV2'. A detailed configuration of the control circuit 1202 will be described with reference to FIG. 13.

Figure 13:
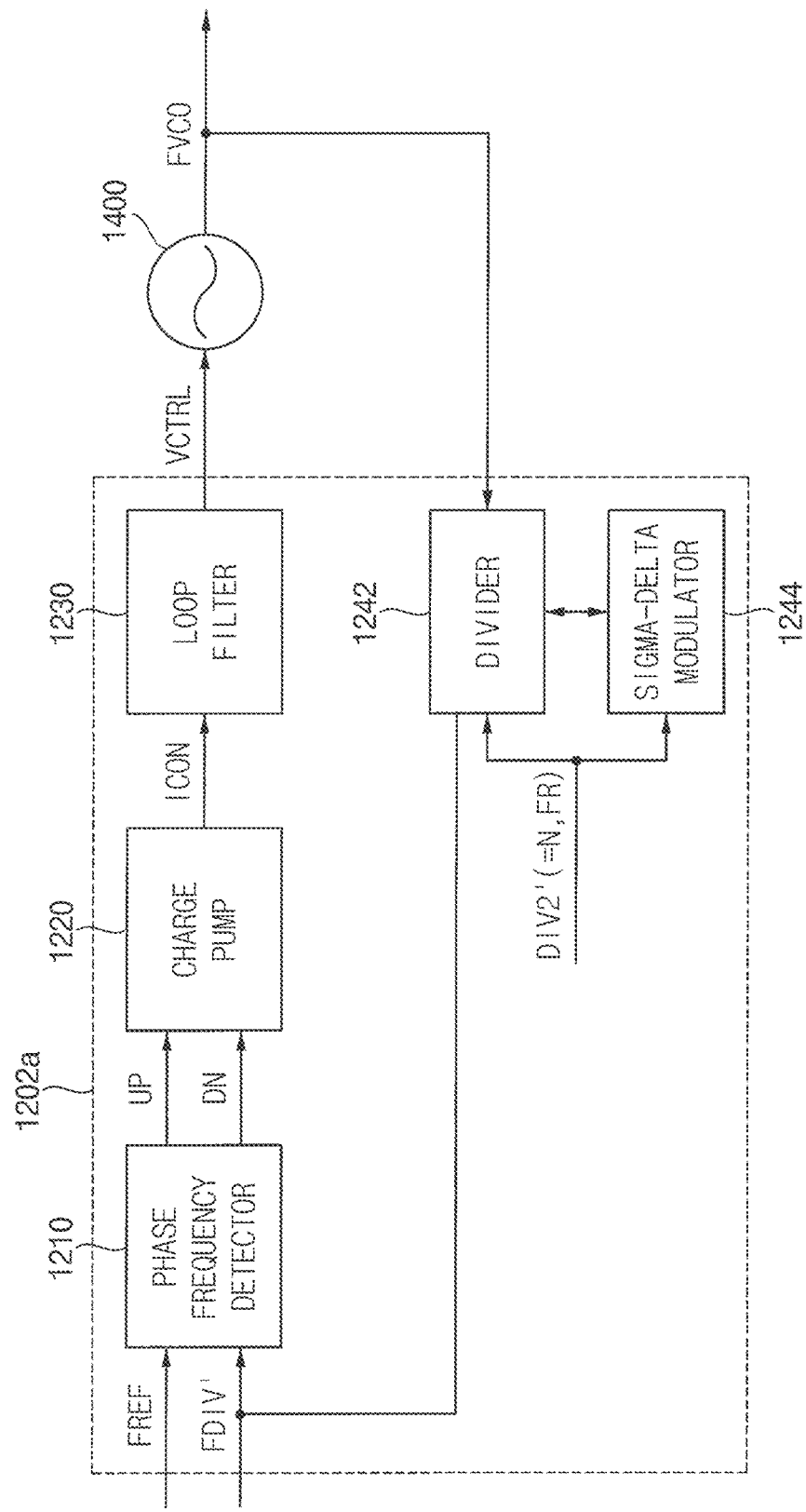
FIG. 13 is a block diagram illustrating an example of a control circuit included in a phase locked loop of FIG. 12.

FIG. 13 is a block diagram illustrating an example of a control circuit included in a phase locked loop of FIG. 12. The descriptions repeated with FIG. 10 will be omitted.

Referring to FIG. 13, a control circuit 1202a may include a phase frequency detector 1210, a charge pump 1220, a loop filter 1230, a divider 1242 and a sigma-delta modulator 1244.

The control circuit 1202a may be the same or substantially the same as the control circuit 1200a of FIG. 10, except that the control circuit 1202a further includes the sigma-delta modulator 1244 and a configuration of the divider 1242 is partially changed. According to at least some example embodiments of the inventive concepts, each of the divider 1242 and sigma-delta modulator 1244 may be embodied by a circuit and/or circuitry. Accordingly, the divider 1242 and sigma-delta modulator 1244 may also be referred to, in the present specification, as the divider circuit 1242 and sigma-delta modulator circuit 1244, respectively.

The divider 1242 and the sigma-delta modulator 1244 may generate the divided output frequency signal FDIV' by dividing the output frequency signal FVCO based on the second division control signal DIV2'. For example, the divider 1242 and the sigma-delta modulator 1244 may generate the divided output frequency signal FDIV' by dividing the output frequency signal FVCO based on the integer N and the fraction FR in the second division control signal DIV2'. For example, a circuit including the divider 1242 and the sigma-delta modulator 1244 may be referred to as a fractional-N divider.

Figure 14:
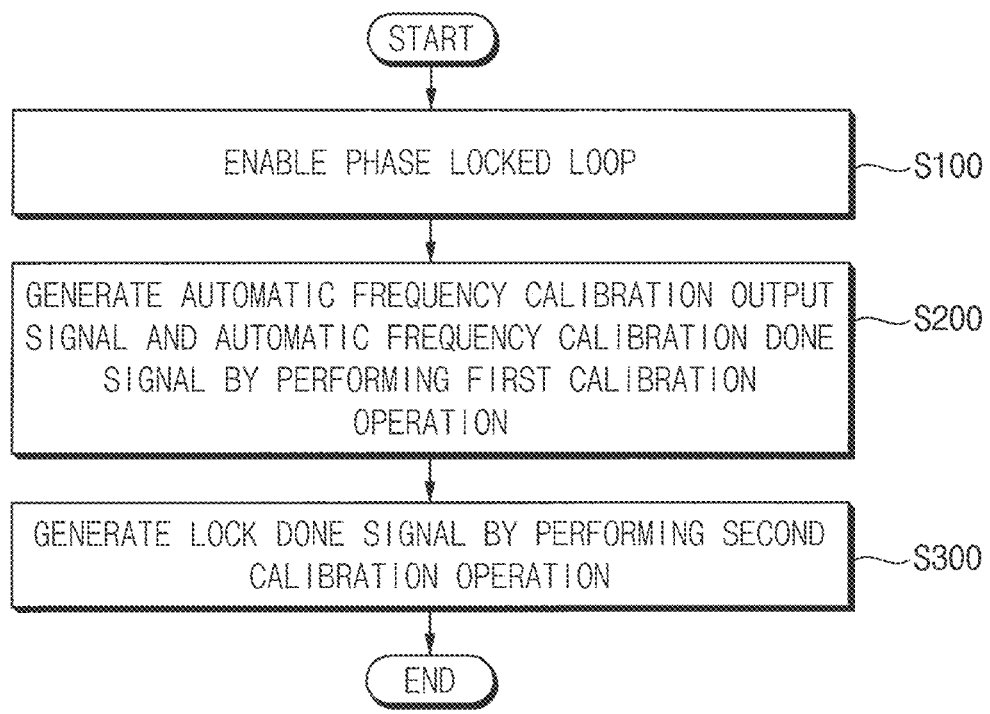
FIG. 14 is a flowchart illustrating an automatic frequency calibration and lock detection method according to at least some example embodiments of the inventive concepts.

FIG. 14 is a flowchart illustrating an automatic frequency calibration and lock detection method according to at least some example embodiments of the inventive concepts.

Referring to FIGS. 1, 8 and 14, in an automatic frequency calibration and lock detection method according to at least some example embodiments of the inventive concepts, the phase locked loop 1000 is enabled (step S100). For example, the phase locked loop 1000 and an integrated circuit and/or chip including the phase locked loop 1000 may be powered on.

The automatic frequency calibration output signal AFC_OUT and the automatic frequency calibration done signal AFC_DONE are generated by performing the first calibration operation (step S200). For example, step S200 may be performed by the frequency error generator 200 and the automatic frequency calibration signal generator 300, and may be performed by the first loop including the automatic frequency calibration and lock detection circuit 1100, the capacitor bank array 1300 and the voltage controlled oscillator 1400. Step S200 will be described with reference to FIGS. 15 and 16.

The lock done signal LOCK_DONE is generated by performing the second calibration operation and the lock detection operation (step S300). For example, step S200 may be performed by the frequency error generator 200 and the lock flag generator 400, and may be performed by the second loop including the control circuit 1200 and the voltage controlled oscillator 1400. Step S300 will be described with reference to FIG. 17.

Figure 15:
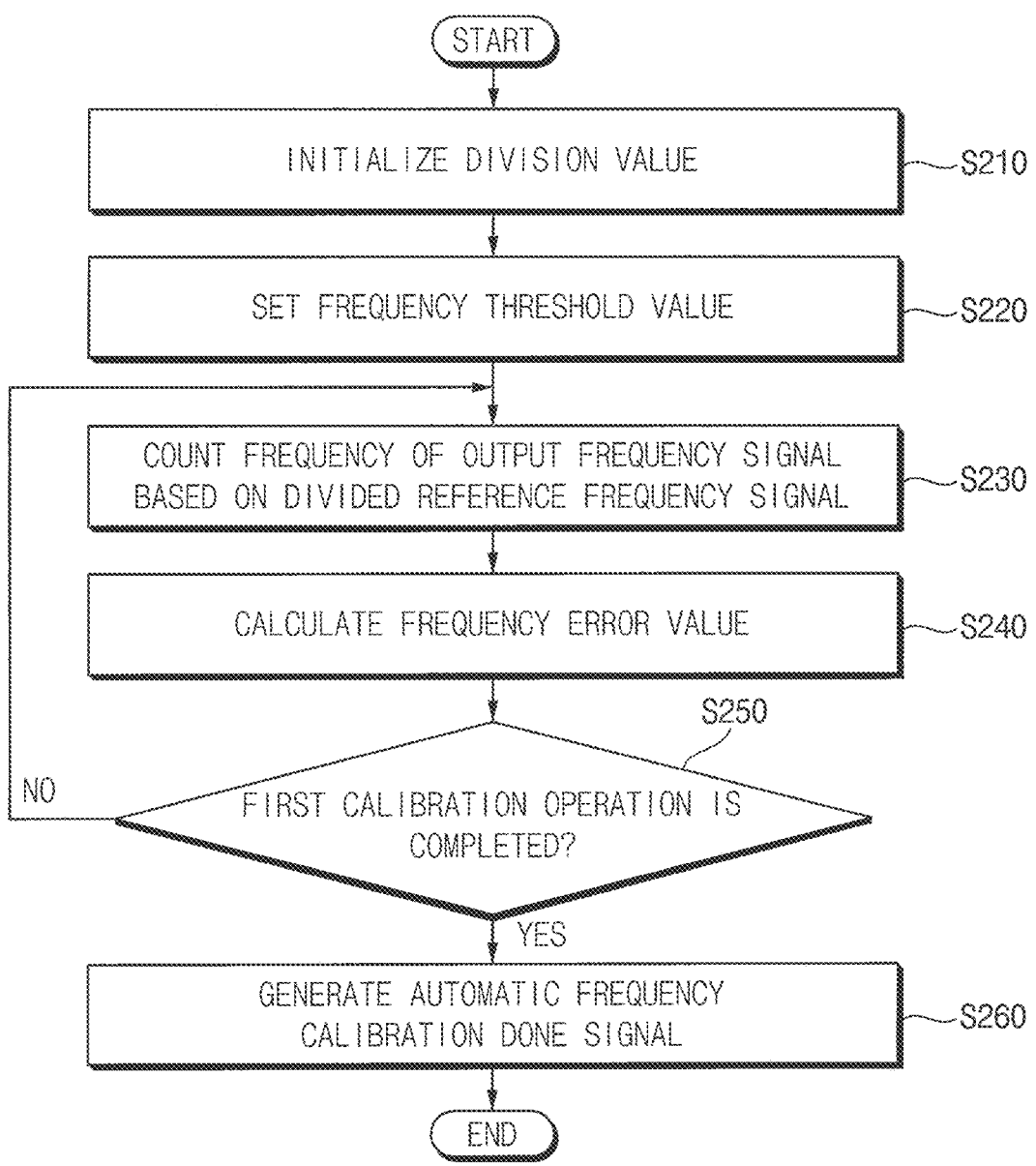
FIG. 15 is a flowchart illustrating an example of generating an automatic frequency calibration output signal and an automatic frequency calibration done signal in FIG. 14.

FIG. 15 is a flowchart illustrating an example of generating an automatic frequency calibration output signal and an automatic frequency calibration done signal in FIG. 14.

Referring to FIGS. 1, 3, 14 and 15, when generating the automatic frequency calibration output signal AFC_OUT and the automatic frequency calibration done signal AFC_DONE (step S200), the division value may be initialized (step S210), and the frequency threshold value TH may be set (step S220). For example, the integer K in the first division control signal DIV1 may be set, the integer N in the second division control signal DIV2 may be initialized, and the frequency threshold value TH may be obtained based on Equation 1. For another example, the integer N and the fraction FR in the second division control signal DIV2' may be initialized, and the frequency threshold value TH may be obtained based on the integer N and the fraction FR.

The frequency of the output frequency signal FVCO may be counted based on the divided reference frequency signal FREF/K (step S230), and the frequency count signal FCNT including the count value F may be generated based on the counting operation in step S230. The frequency error value may be calculated based on the count value F and the frequency threshold value TH included in the frequency threshold signal FTHV (step S240), and the frequency error signal FREQ_ERROR including the frequency error value may be generated based on step S240. The automatic frequency calibration output signal AFC_OUT may be generated based on the frequency error signal FREQ_ERROR.

In addition, it may be checked based on the automatic frequency calibration output signal AFC_OUT whether the first calibration operation is completed (step S250). When the first calibration operation is not completed (step S250: NO), steps S230, S240 and S250 may be performed again. When the first calibration operation is completed (step S250: YES), the automatic frequency calibration done signal AFC_DONE that is activated may be generated (step S260).

Figure 16:
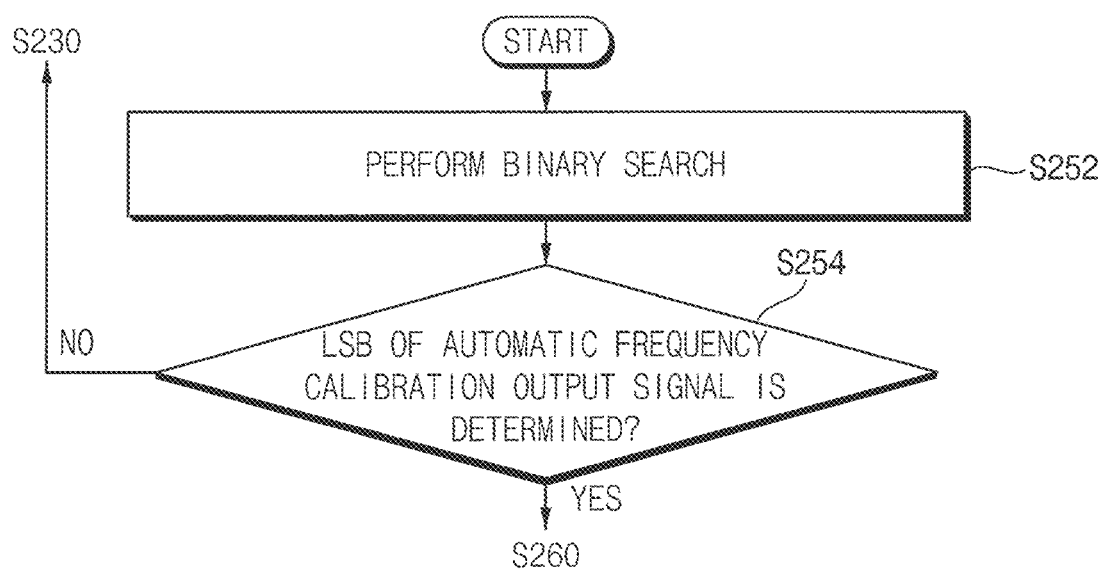
FIG. 16 is a flowchart illustrating an example of determining whether a first calibration operation is completed in FIG. 15.

FIG. 16 is a flowchart illustrating an example of determining whether a first calibration operation is completed in FIG. 15.

Referring to FIGS. 1, 3, 15 and 16, when determining whether the first calibration operation is completed (step S250), the binary search may be performed (step S252), and it may be checked whether the LSB of the automatic frequency calibration output signal AFC_OUT is determined (step S254). For example, steps S252 and S254 may be performed when the automatic frequency calibration signal generator 300 includes the successive approximation register 320.

When the LSB of the automatic frequency calibration output signal AFC_OUT is not determined (step S254: NO), it may be determined that the first calibration operation is not completed, and step S230 may be performed again. When the LSB of the automatic frequency calibration output signal AFC_OUT is determined (step S254: YES), it may be determined that the first calibration operation is completed, and step S260 may be performed.

According to at least some example embodiments of the inventive concepts, operations of FIGS. 15 and 16 may be performed as described with reference to FIG. 11A.

Figure 17:
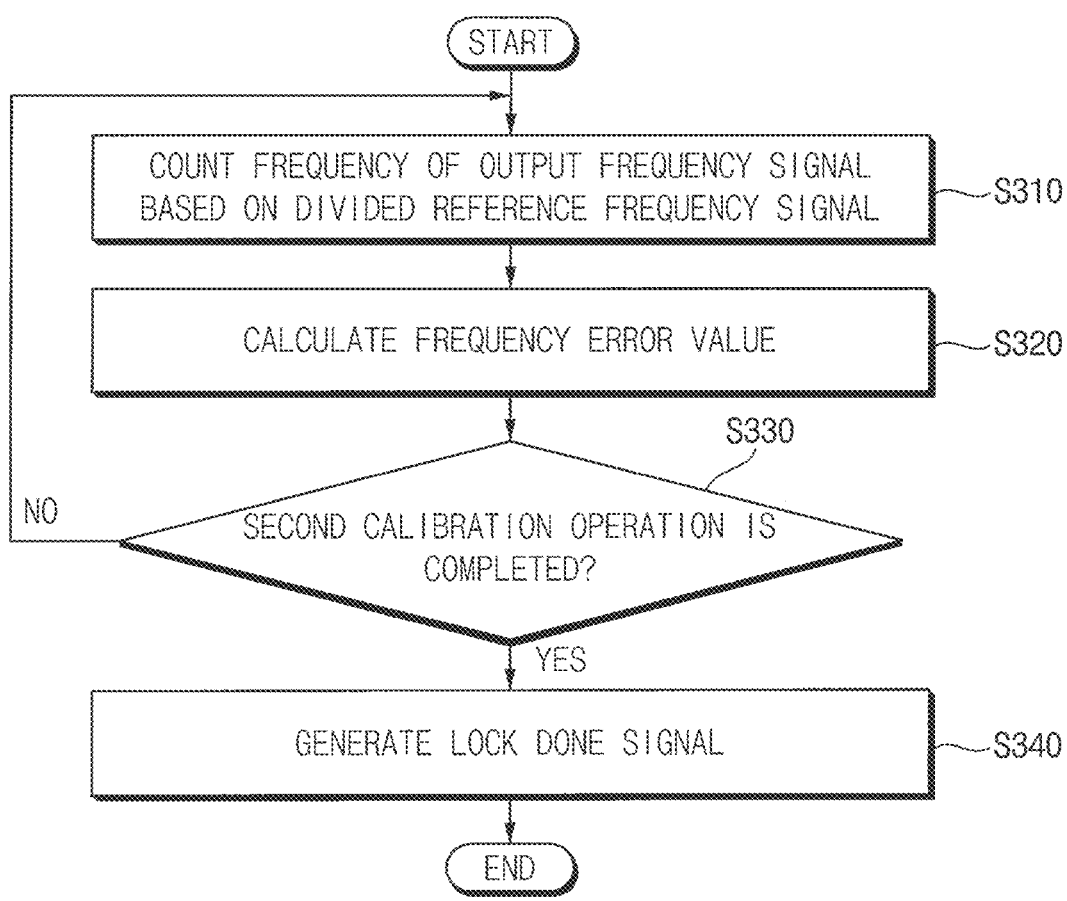
FIG. 17 is a flowchart illustrating an example of generating a lock done signal in FIG. 14.

FIG. 17 is a flowchart illustrating an example of generating a lock done signal in FIG. 14.

Referring to FIGS. 1, 3, 14 and 17, when generating the lock done signal LOCK_DONE (step S300), the frequency of the output frequency signal FVCO may be counted based on the divided reference frequency signal FREF/K (step S310), and the frequency count signal FCNT including the count value F may be generated based on the counting operation in step S310. The frequency error value may be calculated based on the count value F and the frequency threshold value TH included in the frequency threshold signal FTHV (step S320), and the frequency error signal FREQ_ERROR including the frequency error value may be generated based on step S320. Steps S310 and S320 may be similar to steps S230 and S240 in FIG. 15, respectively.

In addition, it may be checked whether the second calibration operation is completed (step S330). When the second calibration operation is not completed (step S330: NO), steps S310, S320 and S330 may be performed again. When the second calibration operation is completed (step S330: YES), the lock done signal LOCK_DONE that is activated may be generated (step S340). For example, when all bits of "FREQ_ERROR<M−1:1>" are "1" or "0", it may be determined that the second calibration operation is completed.

According to at least some example embodiments of the inventive concepts, an operation of FIG. 17 may be performed as described with reference to FIG. 11B.

As will be appreciated by those skilled in the art, at least some example embodiments of the inventive concepts may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 18:
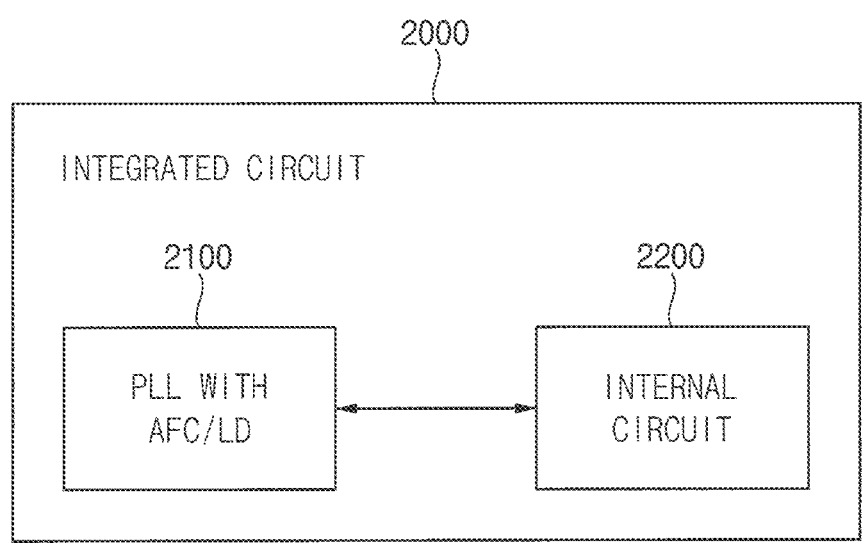
FIG. 18 is a block diagram illustrating an integrated circuit including a phase locked loop according to at least some example embodiments of the inventive concepts.

FIG. 18 is a block diagram illustrating an integrated circuit including a phase locked loop according to at least some example embodiments of the inventive concepts.

Referring to FIG. 18, an integrated circuit 2000 includes a phase locked loop 2100 and an internal circuit 2200.

The phase locked loop 2100 may be the phase locked loop according to at least some example embodiments of the inventive concepts. For example, the phase locked loop 2100 may include an automatic frequency calibration and lock detection circuit AFC/LD in which the frequency error generator 200 is shared by the automatic frequency calibration signal generator 300 performing the automatic frequency calibration function and the lock flag generator 400 performing the lock detection function. Accordingly, the phase locked loop 2100 may be efficiently implemented such that the phase locked loop 2100 performs the same performance and function with the reduced circuit area.

The internal circuit 2200 may be driven or perform a specific operation based on an output frequency signal from the phase locked loop 2100.

Figure 19:
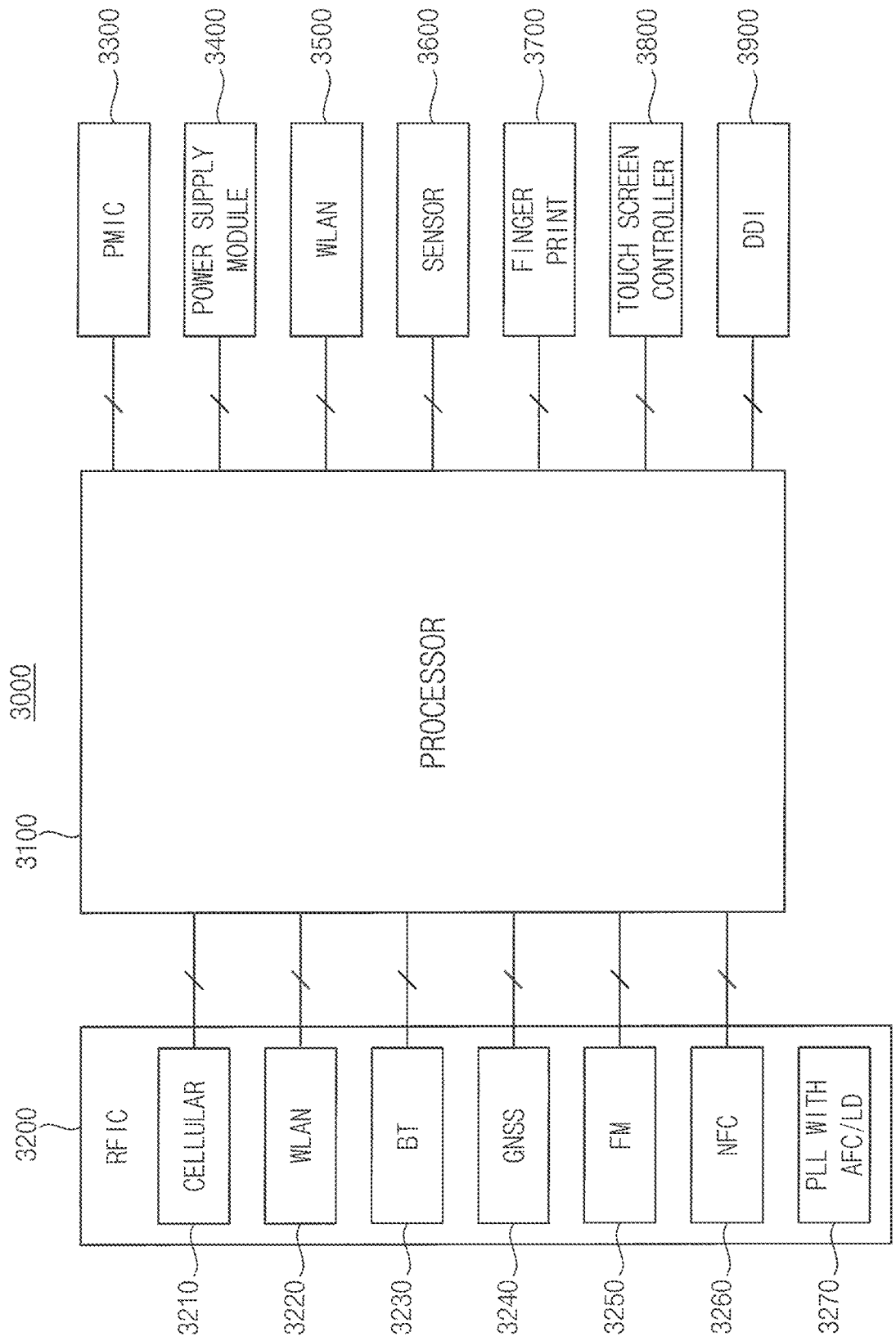
FIG. 19 is a block diagram illustrating a digital processing system according to at least some example embodiments of the inventive concepts.

FIG. 19 is a block diagram illustrating a digital processing system according to at least some example embodiments of the inventive concepts.

Referring to FIG. 19, a digital processing system 3000 includes a master device 3100 and a plurality of slave devices 3200, 3300, 3400, 3500, 3600, 3700, 3800 and 3900.

According to at least some example embodiments of the inventive concepts, the digital processing system 3000 may be any electronic system, such as a personal computer (PC), a mobile phone, a smart phone, a tablet computer, a laptop computer, a personal digital assistant (PDA), an enterprise digital assistant (EDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The master device 3100 may be a controller circuit or a processor which can actively control the plurality of slave devices 3200, 3300, 3400, 3500, 3600, 3700, 3800 and 3900.

For example, the master device 3100 may be implemented as a baseband modem processor chip, a chip which can function as both a modem and an application processor (AP), an AP, or a mobile AP, but at least some example embodiments of the inventive concepts are not limited thereto.

Each of the slave devices 3200, 3300, 3400, 3500, 3600, 3700, 3800 and 3900 may be one of various circuits or devices which can passively operate based on a control of the master device 3100. For example, the slave devices 3200, 3300, 3400, 3500, 3600, 3700, 3800 and 3900 may include a radio frequency integrated circuit (RFIC) 3200, a power management integrated circuit (PMIC) 3300, a power supply module 3400, a secondary RFIC 3500, a sensor 3600, a fingerprint recognition chip 3700, a touch screen controller 1800, and a display driver integrated circuit or digital display interface (DDI) 900.

The RFIC 3200 may include at least one connectivity chip. For example, the connectivity chip may include a chip 3210 for mobile communication, a chip 3220 for wireless local area network (WLAN) (e.g., WiFi), a chip 3230 for Bluetooth communication, a chip 3240 for global navigation satellite system (GNSS) communication, a chip 3250 for processing frequency modulation (FM) audio/video, and a chip 3260 for near field communication (NFC), but at least some example embodiments of the inventive concepts are not limited thereto.

The RFIC 3200 may further include at least one phase locked loop 3270. The phase locked loop 3270 may be the phase locked loop according to at least some example embodiments of the inventive concepts. For example, the phase locked loop 3270 may include an automatic frequency calibration and lock detection circuit AFC/LD in which the frequency error generator 200 is shared by the automatic frequency calibration signal generator 300 and the lock flag generator 400. Accordingly, the phase locked loop 3270 may be efficiently implemented such that the phase locked loop 3270 performs the same performance and function with the reduced circuit area.

According to at least some example embodiments of the inventive concepts, the phase locked loop 3270 may be formed to correspond to each connectivity chip.

At least some example embodiments of the inventive concepts may be applied to various electronic devices and systems that include the automatic frequency calibration and lock detection circuits, and the phase locked loops. For example, at least some example embodiments of the inventive concepts may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An automatic frequency calibration and lock detection circuit comprising:
   a frequency error generator circuit configured to generate a frequency error signal based on a reference frequency signal and an output frequency signal, the frequency error signal representing a difference between a frequency of the output frequency signal and a target frequency;
   an automatic frequency calibration signal generator circuit configured to generate an automatic frequency calibration output signal and an automatic frequency calibration done signal based on the frequency error signal and a first clock signal, the automatic frequency calibration output signal representing a result of a first calibration operation on the output frequency signal, the automatic frequency calibration done signal representing a completion of the first calibration operation; and
   a lock flag generator circuit configured to generate a lock done signal based on the frequency error signal, the automatic frequency calibration done signal and a second clock signal, the lock done signal representing a completion of a second calibration operation on the output frequency signal,
   wherein the frequency error generator circuit is shared by the automatic frequency calibration signal generator circuit and the lock flag generator circuit.

2. The automatic frequency calibration and lock detection circuit of claim 1, wherein:
   during a first operation phase in which the first calibration operation is performed, the automatic frequency calibration signal generator circuit is enabled and the lock flag generator circuit is disabled, and
   during a second operation phase in which the second calibration operation is performed subsequent to the first operation phase, the automatic frequency calibration signal generator circuit is disabled and the lock flag generator circuit is enabled.

3. The automatic frequency calibration and lock detection circuit of claim 2, wherein the automatic frequency calibration signal generator circuit and the lock detection circuit are configured such that,
   during the first operation phase, the automatic frequency calibration done signal is deactivated and the lock flag generator circuit is disabled based on the automatic frequency calibration done signal, and
   during the second operation phase, the automatic frequency calibration done signal is activated and the lock flag generator circuit is enabled based on the automatic frequency calibration done signal.

4. The automatic frequency calibration and lock detection circuit of claim 2, wherein:
   the first calibration operation is a coarse calibration operation for calibrating the frequency of the output frequency signal such that the output frequency signal has a first frequency close to the target frequency, and
   the second calibration operation is a fine calibration operation for calibrating the frequency of the output frequency signal such that the output frequency signal has the target frequency.

5. The automatic frequency calibration and lock detection circuit of claim 1, wherein the frequency error generator circuit comprises:
- a frequency counter circuit configured to generate a frequency count signal and a frequency threshold signal based on the reference frequency signal, the output frequency signal, a first division control signal and a second division control signal, the frequency count signal representing a count value for the output frequency signal, the frequency threshold signal representing the target frequency; and
- a digital comparator circuit configured to generate the frequency error signal by comparing the frequency count signal with the frequency threshold signal.

6. The automatic frequency calibration and lock detection circuit of claim 5, wherein the frequency counter circuit is configured to generate a divided reference frequency signal by dividing the reference frequency signal based on the first division control signal, and to generate the frequency count signal by counting the frequency of the output frequency signal based on the divided reference frequency signal.

7. The automatic frequency calibration and lock detection circuit of claim 6, wherein the frequency counter circuit is configured to generate the frequency count signal by counting a number of rising edges or falling edges of the output frequency signal during a time interval between a rising edge and a falling edge included in one period of the divided reference frequency signal.

8. The automatic frequency calibration and lock detection circuit of claim 5, wherein the frequency error generator circuit is configured such that a frequency threshold value that is included in the frequency threshold signal and corresponds to the target frequency is determined based on the first division control signal and the second division control signal.

9. The automatic frequency calibration and lock detection circuit of claim 5, wherein the frequency counter circuit includes a Gray code frequency counter circuit configured to generate the frequency count signal and the frequency threshold signal based on Gray code.

10. The automatic frequency calibration and lock detection circuit of claim 9, wherein the frequency error generator circuit further includes:
- a Gray-to-binary converter circuit configured to generate the frequency error signal by performing a Gray-to-binary conversion on an output of the digital comparator circuit.

11. The automatic frequency calibration and lock detection circuit of claim 5, wherein the first division control signal is differently set when the first calibration operation is performed and when the second calibration operation is performed.

12. The automatic frequency calibration and lock detection circuit of claim 5, wherein the second division control signal includes an integer.

13. The automatic frequency calibration and lock detection circuit of claim 12, wherein the second division control signal further includes a fraction.

14. The automatic frequency calibration and lock detection circuit of claim 5, further comprising:
- a timing generator circuit configured to generate the first clock signal, the second clock signal and the first division control signal.

15. The automatic frequency calibration and lock detection circuit of claim 1, wherein the automatic frequency calibration signal generator circuit includes a finite state machine (FSM) circuit.

16. The automatic frequency calibration and lock detection circuit of claim 15, wherein the automatic frequency calibration signal generator circuit includes a successive approximation register (SAR) circuit.

17. A phase locked loop comprising:
- an automatic frequency calibration and lock detection circuit configured to generate an automatic frequency calibration output signal and a lock done signal based on a reference frequency signal and an output frequency signal, the automatic frequency calibration output signal representing a result of a first calibration operation on the output frequency signal, the lock done signal representing a completion of a second calibration operation on the output frequency signal;
- a control circuit configured to generate a voltage control signal based on the reference frequency signal and the output frequency signal;
- a capacitor bank array, at least a part of the capacitor bank array being selectively enabled based on the automatic frequency calibration output signal; and
- a voltage controlled oscillator (VCO) circuit configured to generate the output frequency signal based on the capacitor bank array and the voltage control signal, and
- wherein the automatic frequency calibration and lock detection circuit includes:
  - a frequency error generator circuit configured to generate a frequency error signal based on the reference frequency signal and the output frequency signal, the frequency error signal representing a difference between a frequency of the output frequency signal and a target frequency;
  - an automatic frequency calibration signal generator circuit configured to generate the automatic frequency calibration output signal and an automatic frequency calibration done signal based on the frequency error signal and a first clock signal, the automatic frequency calibration done signal representing a completion of the first calibration operation; and
  - a lock flag generator circuit configured to generate the lock done signal based on the frequency error signal, the automatic frequency calibration done signal and a second clock signal, and
  - wherein the frequency error generator circuit is shared by the automatic frequency calibration signal generator circuit and the lock flag generator circuit.

18. The phase locked loop of claim 17, wherein:
- the capacitor bank array includes a plurality of capacitor circuits that are connected in parallel between a first node and a second node,
- each of the plurality of capacitor circuits includes at least one capacitor and at least one switch that are connected in series between the first node and the second node, and
- each of the plurality of capacitor circuits is enabled or disabled by turning on or off the at least one switch based on the automatic frequency calibration output signal.

19. The phase locked loop of claim 17, wherein the control circuit includes:
- a divider circuit configured to generate a divided output frequency signal by dividing the output frequency signal;
- a phase frequency detector circuit configured to generate a phase detection signal based on the reference frequency signal and the divided output frequency signal;

a charge pump circuit configured to generate a control current based on the phase detection signal; and a loop filter circuit configured to generate the voltage control signal based on the control current.

20. An automatic frequency calibration and lock detection circuit comprising:

a frequency counter circuit configured to generate a frequency count signal and a frequency threshold signal based on a reference frequency signal, an output frequency signal, a first division control signal and a second division control signal, the frequency count signal representing a count value for the output frequency signal, the frequency threshold signal representing a target frequency;

a digital comparator circuit configured to generate a frequency error signal by comparing the frequency count signal with the frequency threshold signal, the frequency error signal representing a difference between a frequency of the output frequency signal and the target frequency;

an automatic frequency calibration signal generator circuit configured to generate an automatic frequency calibration output signal and an automatic frequency calibration done signal based on the frequency error signal and a first clock signal, the automatic frequency calibration output signal representing a result of a first calibration operation on the output frequency signal, the automatic frequency calibration done signal representing a completion of the first calibration operation;

a lock flag generator circuit configured to generate a lock done signal based on the frequency error signal, the automatic frequency calibration done signal and a second clock signal, the lock done signal representing a completion of a second calibration operation on the output frequency signal; and a timing generator circuit configured to generate the first clock signal, the second clock signal and the first division control signal, wherein, during a first operation phase in which the first calibration operation is performed, the automatic frequency calibration signal generator circuit is enabled and the lock flag generator circuit is disabled, wherein, during a second operation phase in which the second calibration operation is performed subsequent to the first operation phase, the automatic frequency calibration signal generator circuit is disabled and the lock flag generator circuit is enabled, wherein the frequency counter circuit is configured to generate a divided reference frequency signal by dividing the reference frequency signal based on the first division control signal, and to generate the frequency count signal by counting the frequency of the output frequency signal based on the divided reference frequency signal, and wherein a frequency threshold value that is included in the frequency threshold signal and corresponds to the target frequency is determined based on the first division control signal and the second division control signal.

* * * * *